US012610562B2

(12) United States Patent
Huang et al.

(10) Patent No.: US 12,610,562 B2
(45) Date of Patent: Apr. 21, 2026

(54) METHODS OF FORMING BONDING STRUCTURES

(71) Applicant: Taiwan Semiconductor Manufacturing Company, Ltd., Hsin-Chu (TW)

(72) Inventors: Hsing-Yuan Huang, Hsinchu (TW); Chin-Szu Lee, Taoyuan (TW); Yi Chen Ho, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 350 days.

(21) Appl. No.: 18/313,786

(22) Filed: May 8, 2023

(65) Prior Publication Data

US 2024/0203923 A1 Jun. 20, 2024

Related U.S. Application Data

(60) Provisional application No. 63/387,603, filed on Dec. 15, 2022.

(51) Int. Cl.
*H01L 23/00* (2006.01)
*H01L 25/065* (2023.01)
*H10B 80/00* (2023.01)

(52) U.S. Cl.
CPC .............. *H01L 24/19* (2013.01); *H01L 24/05* (2013.01); *H01L 24/20* (2013.01); *H01L 24/24* (2013.01);

(Continued)

(58) Field of Classification Search
CPC ......... H01L 24/19; H01L 24/05; H01L 24/20; H01L 24/24; H01L 25/0657; H01L 24/32;
(Continued)

(56) References Cited

U.S. PATENT DOCUMENTS

2003/0089903 A1* 5/2003 Nakata .............. H01L 21/02211
257/65
2004/0132277 A1 7/2004 Maekawa
(Continued)

FOREIGN PATENT DOCUMENTS

KR 20190055750 A 5/2019
KR 20210005433 A 1/2021
TW 200534426 A 10/2005

*Primary Examiner* — Thanh Y. Tran
(74) *Attorney, Agent, or Firm* — HAYNES AND BOONE, LLP

(57) ABSTRACT

A method includes forming a conductive pad over a substrate, forming a multi-layer passivation structure on the conducive pad, patterning a top portion of the multi-layer passivation structure to form a first opening, forming a mask film on sidewall surfaces of the patterned top portion of the multi-layer passivation structure, after the forming of the mask film, performing a first etching process to remove a portion of the multi-layer passivation structure directly under the first opening to form a second opening, after the performing of the first etching process, selectively removing the mask film, performing a second etching process to remove a portion of the multi-layer passivation structure directly under the second opening, thereby forming a third opening exposing the conductive pad, and forming a bonding structure in the third opening, where an etchant of the second etching process is different than an etchant of the first etching process.

20 Claims, 20 Drawing Sheets

(52) U.S. Cl.
 CPC ......... *H01L 25/0657* (2013.01); *H10B 80/00*
 (2023.02); *H01L 24/32* (2013.01); *H01L 24/73*
 (2013.01); *H01L 2224/05624* (2013.01); *H01L*
 *2224/19* (2013.01); *H01L 2224/215* (2013.01);
 *H01L 2224/24011* (2013.01); *H01L 2224/2405*
 (2013.01); *H01L 2224/24146* (2013.01); *H01L*
 *2224/32221* (2013.01); *H01L 2224/73267*
 (2013.01); *H01L 2225/06527* (2013.01); *H01L*
 *2225/06568* (2013.01); *H01L 2924/1431*
 (2013.01); *H01L 2924/1437* (2013.01); *H01L*
 *2924/3511* (2013.01); *H01L 2924/35121*
 (2013.01)

(58) Field of Classification Search
 CPC ................. H01L 24/73; H01L 2224/19; H01L
 2224/215; H01L 2224/2405; H01L
 2224/24146; H01L 2224/32221; H01L
 2224/73267; H10B 80/00
 See application file for complete search history.

(56) References Cited

U.S. PATENT DOCUMENTS

| | | | |
|---|---|---|---|
| 2008/0318409 | A1 | 12/2008 | Sakata |
| 2018/0122844 | A1 * | 5/2018 | Li .......................... H10F 39/014 |
| 2019/0148351 | A1 * | 5/2019 | Chen ................. H01L 21/76898 |
| | | | 257/678 |
| 2022/0262778 | A1 * | 8/2022 | Yu ........................... H01L 25/50 |

* cited by examiner

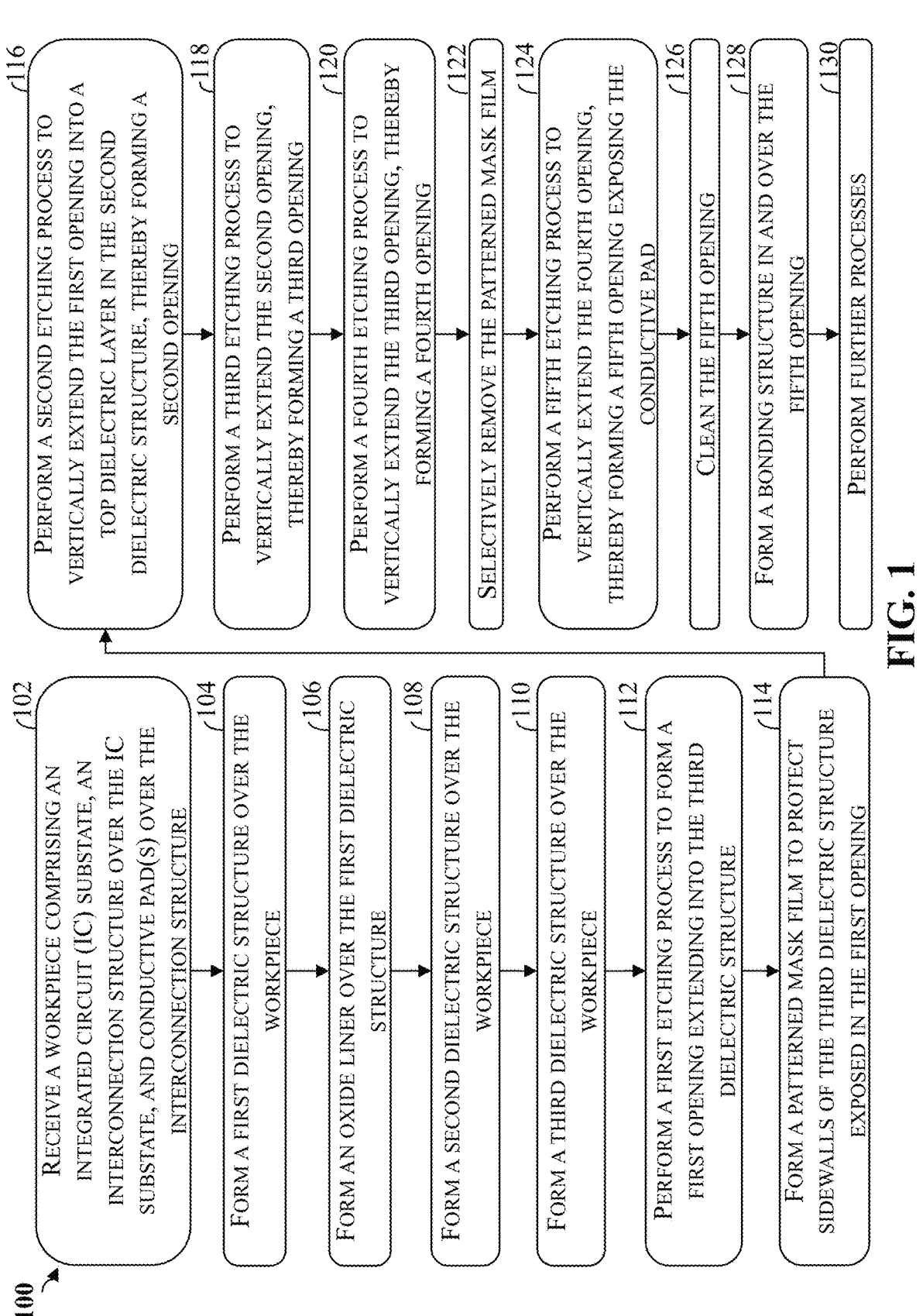

116 — PERFORM A SECOND ETCHING PROCESS TO VERTICALLY EXTEND THE FIRST OPENING INTO A TOP DIELECTRIC LAYER IN THE SECOND DIELECTRIC STRUCTURE, THEREBY FORMING A SECOND OPENING

118 — PERFORM A THIRD ETCHING PROCESS TO VERTICALLY EXTEND THE SECOND OPENING, THEREBY FORMING A THIRD OPENING

120 — PERFORM A FOURTH ETCHING PROCESS TO VERTICALLY EXTEND THE THIRD OPENING, THEREBY FORMING A FOURTH OPENING

122 — SELECTIVELY REMOVE THE PATTERNED MASK FILM

124 — PERFORM A FIFTH ETCHING PROCESS TO VERTICALLY EXTEND THE FOURTH OPENING, THEREBY FORMING A FIFTH OPENING EXPOSING THE CONDUCTIVE PAD

126 — CLEAN THE FIFTH OPENING

128 — FORM A BONDING STRUCTURE IN AND OVER THE FIFTH OPENING

130 — PERFORM FURTHER PROCESSES

102 — RECEIVE A WORKPIECE COMPRISING AN INTEGRATED CIRCUIT (IC) SUBSTATE, AN INTERCONNECTION STRUCTURE OVER THE IC SUBSTATE, AND CONDUCTIVE PAD(S) OVER THE INTERCONNECTION STRUCTURE

104 — FORM A FIRST DIELECTRIC STRUCTURE OVER THE WORKPIECE

106 — FORM AN OXIDE LINER OVER THE FIRST DIELECTRIC STRUCTURE

108 — FORM A SECOND DIELECTRIC STRUCTURE OVER THE WORKPIECE

110 — FORM A THIRD DIELECTRIC STRUCTURE OVER THE WORKPIECE

112 — PERFORM A FIRST ETCHING PROCESS TO FORM A FIRST OPENING EXTENDING INTO THE THIRD DIELECTRIC STRUCTURE

114 — FORM A PATTERNED MASK FILM TO PROTECT SIDEWALLS OF THE THIRD DIELECTRIC STRUCTURE EXPOSED IN THE FIRST OPENING

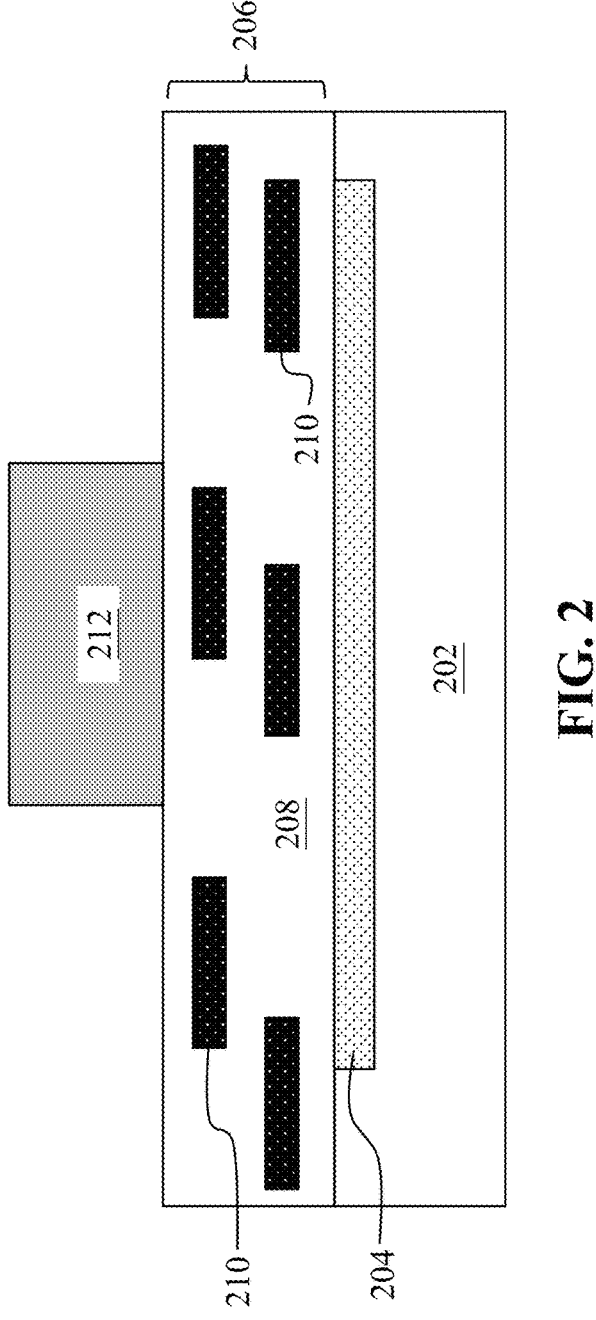
FIG. 2

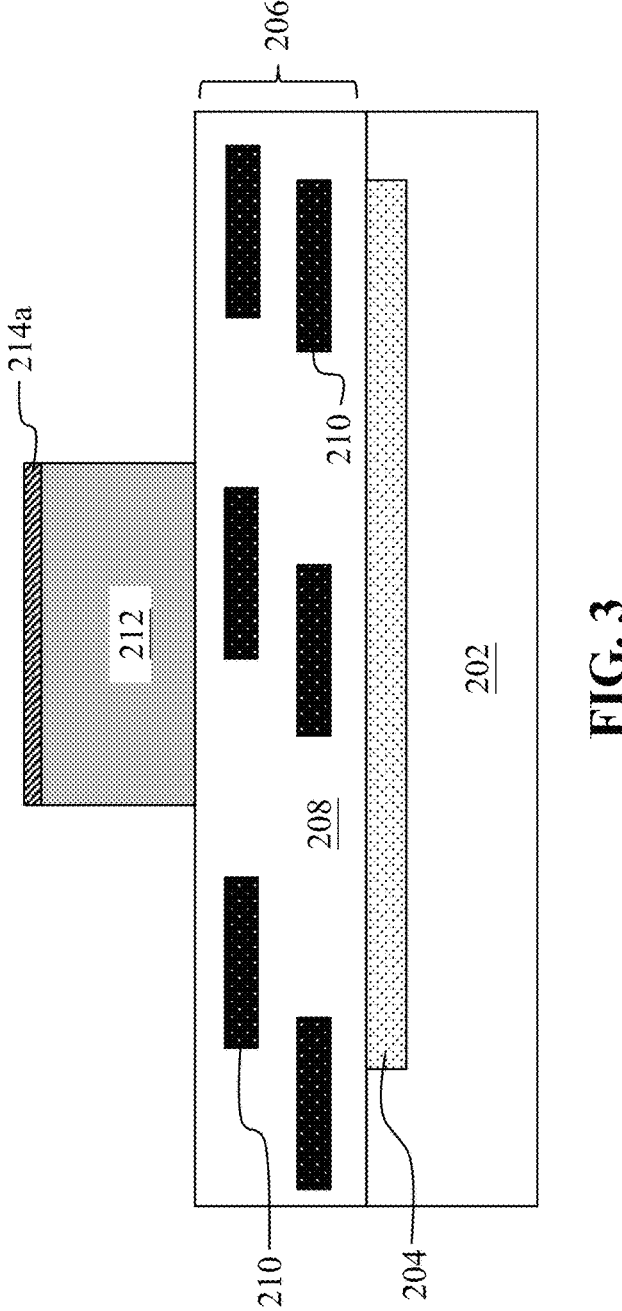
FIG. 3

302
304
306
212
248
309
314
312
310

308b

200'

308a

300

400

METHODS OF FORMING BONDING STRUCTURES

PRIORITY

This claims the benefits to U.S. Provisional Application Ser. No. 63/387,603 filed Dec. 15, 2022, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, packages of integrated circuits are becoming increasingly complex, with more device dies packaged in the same package to achieve more functions. System-on-integrate-chip (SoIC) has been developed to include a number of device dies such as processors and memory cubes in the same package. The SoIC can include device dies formed using different technologies and have different functions bonded to the same device die, thus forming a system. This may save manufacturing cost and optimize device performance. Conductive pads and bonding structures (e.g., bonding pad vias (BPVs) and bonding pad metal lines (BPMs)) are formed in device dies such that the SoIC may be able to fulfill satisfactory electrical functions. Although existing methods for forming the bonding structures are generally adequate, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 illustrates a flow chart of a method for forming a semiconductor structure, in accordance with some embodiments of the present disclosure.

FIGS. 2, 3, 4, 5, 6, 7, 8, 9, 10, 11, 12, 13, 14, 15, 16, 17, 18, 19, and 20 illustrate fragmentary cross-sectional views of a semiconductor structure during a fabrication process according to the method of FIG. 1, according to various aspects of the present disclosure.

DETAILED DESCRIPTION

Figure 4:
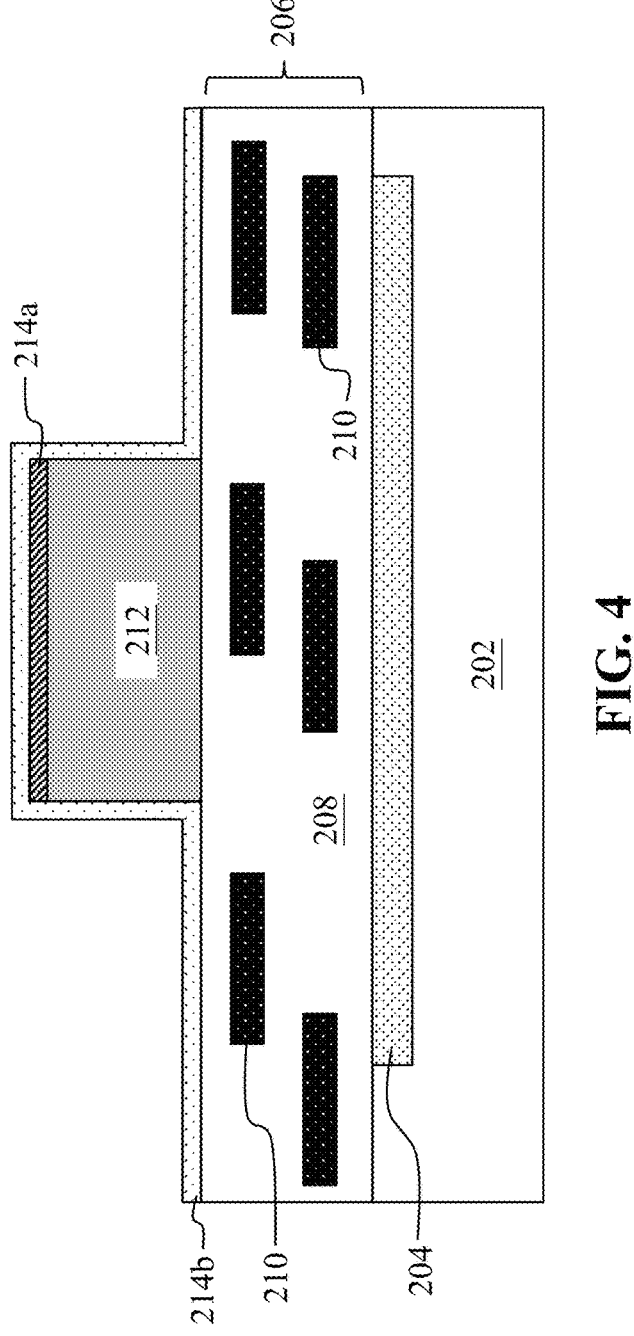

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

The present disclosure provides various embodiments of system-on-integrate-chip (SoIC) packages and the method of forming the same. Particularly, a funnel-shape bonding structure is provided. In an exemplary method, the formation of the funnel-shape bonding structure includes forming a funnel-shape trench extending through a multi-layer dielectric structure to expose a conductive pad. The forming of the funnel-shape trench includes performing a number of etching processes, and each etching process of the number of etching processes is configured to have different parameters (e.g., etchants) to etch different dielectric layers of the multi-layer dielectric structure. By implementing the number of etching processes, the conductive pad may not be over etched. In an embodiment, the multi-layer dielectric structure includes an oxide-rich liner layer sandwiched by two dielectric layers to improve adhesion and thus reduce cracks, peelings, and/or warpage. Some variations of some embodiments are discussed. The intermediate stages of forming SoIC packages are illustrated in accordance with some embodiments. It is appreciated that although the formation of SoIC packages is used as examples to explain the concept of the embodiments of the present disclosure, the embodiments of the present disclosure are readily applicable to other bonding methods and structures.

The various aspects of the present disclosure will now be described in more detail with reference to the figures. In that regard, FIG. 1 is a flowchart illustrating method 100 of forming a semiconductor structure according to embodiments of the present disclosure. Method 100 is described below in conjunction with FIGS. 2-20, which are fragmentary cross-sectional views of a workpiece 200 at different stages of fabrication according to embodiments of method 100. Method 100 is merely an example and is not intended to limit the present disclosure to what is explicitly illustrated therein. Additional steps may be provided before, during, and after the method 100, and some steps described can be replaced, eliminated, or moved around for additional embodiments of the method. Not all steps are described herein in detail for reasons of simplicity. Because the workpiece 200 will be fabricated into a semiconductor structure or a SoIC package upon conclusion of the fabrication processes, the workpiece 200 may be referred to as the semiconductor structure 200 or a SoIC package 200 as the context requires. Throughout the present disclosure, like reference numerals denote like features unless otherwise excepted.

Referring to FIGS. 1 and 2, method 100 includes a block 102 where a workpiece 200 is received. In various embodiments, the workpiece 200 may be referred to as a semiconductor structure 200. The workpiece 200 includes an IC substrate 202. In some embodiments, the IC substrate 202 includes a semiconductor substrate, such as a silicon substrate. The IC substrate 202 may also include various devices, such as field-effect transistors (FETs), memory cells, imaging sensors, passive devices, other devices, or combinations thereof. In some embodiments, the IC substrate 202 includes flat active regions with various IC devices, such as plain field-effect transistors (FETs). In some other embodiments, the IC substrate 202 includes fin-shaped (e.g., vertically protruding) active regions with various IC devices formed thereon. As a non-limiting example, electrical circuitry 204 is shown as being formed in the IC substrate 202 in FIG. 1. The electrical circuitry 204 may include planar type transistors or FinFET type transistors and may be singulated to form individual device structures. The device structure may be an application-specific integrated circuit (ASIC) chip, an analog chip, a sensor chip, a wireless and radio frequency chip, a voltage regulator chip or a memory chip, for example. In an embodiment, the device structure may include a static random-access memory (SRAM) die.

The workpiece 200 also includes an interconnection structure 206 formed over the IC substrate 202. The interconnection structure 206 includes various conductive components, such as metal lines (e.g., metal lines 210), contacts, and vias, to provide horizontal and vertical electrical routing. The metal lines such as the metal lines 210 are distributed in multiple metal layers, such as a first metal layer (e.g., a M1 layer), a second metal layer (e.g., a M2 layer), . . . and a top metal layer. Among other things, the conductive components of the interconnection structure 206 may provide electrical connectivity to the electrical circuitry 204. The interconnection structure 206 also includes a dielectric material 208 to provide electrical isolation among the various conductive components, so as to prevent electrical shorting. The dielectric material 208 may include multiple dielectric layers and may be formed of Phospho Silicate Glass (PSG), Boro Silicate Glass (BSG), Boron-Doped Phospho Silicate Glass (BPSG), Fluorine-Doped Silicate Glass (FSG), Tetra Ethyl Ortho Silicate (TEOS), or the like and may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like. In some embodiments, the dielectric material 208 may be formed from a low-k dielectric material having a k-value lower than about 3.0. The dielectric material 208 may also be formed from an extra-low-k (ELK)

dielectric material having a k-value of less than 2.5. In some embodiments, the dielectric material 208 may be formed from an oxygen-containing and/or carbon containing low-k dielectric material, Hydrogen SilsesQuioxane (HSQ), MethylSilsesQuioxane (MSQ), the like, or a combination thereof. In some embodiments, some or all of dielectric layers of the dielectric material 208 are formed of non-low-k dielectric materials such as silicon oxide, silicon carbide (SiC), silicon carbonitride (SiCN), silicon oxycarbonitride (SiOCN), or the like. In some embodiments, etch stop layers (not shown), which may be formed of silicon carbide, silicon nitride, or the like, are formed between dielectric layers of the dielectric material 208. In some embodiments, the dielectric layers of the dielectric material 208 are formed from a porous material such as SiOCN, SiCN, SiOC, SiOCH, or the like. In some embodiments, the interconnection structure 206 may include one or more other types of layers, such as diffusion barrier layers (not shown). In some embodiments, the conductive components (e.g., metal lines 210) of the interconnection structure 206 may be formed of one or more conductive materials selected from, for example, tungsten, aluminum, copper, titanium, tantalum, titanium nitride, tantalum nitride, or alloys thereof.

In some embodiments, the interconnection structure 206 may be formed using a single and/or a dual damascene process, a via-first process, or a metal-first process. In an embodiment, an insulating layer (not separately labeled) is formed, and openings (not shown) are formed therein using acceptable photolithography and etching techniques. Diffusion barrier layers (not shown) may be formed in the openings and may include a material such as TaN, Ta, TiN, Ti, CoW, or the like, and may be formed in the openings using a deposition process such as CVD, Atomic Layer Deposition (ALD), or the like. A conductive material may be formed in the openings from copper, aluminum, nickel, tungsten, cobalt, silver, combinations thereof, or the like, and may be formed over the diffusion barrier layers in the openings using an electro-chemical plating process, chemical vapor deposition (CVD), atomic layer deposition (ALD), physical vapor deposition (PVD), the like, or a combination thereof. After formation of the conductive material, excess conductive material may be removed using, for example, a planarization process such as chemical mechanical polishing (CMP), thereby leaving conductive features (e.g., metal lines 210) in the openings of the respective insulating layer. The process may then be repeated to form additional insulating layers and conductive features therein.

The workpiece 200 also includes one or more conductive pads 212 formed over the interconnection structure 206. For ease of description, only one conductive pad 212 is explicitly shown in FIG. 2, but it is understood that the workpiece 200 may include any suitable number of conductive pads 212. The conductive pad 212 may extend into the dielectric material 208 to make electrical connection with one or more of the conductive components (e.g., metal lines 210) of the interconnection structure 206. For example, the conductive pad 212 may be formed to be in electrical and physical contact with one of the metal lines 210. The conductive pad 212 may also be used to provide electrical connectivity to the interconnection structure 206, and in turn, provide electrical connectivity to the rest of the devices or components of a die, such as the electrical circuitry 204. In some embodiments, the conductive pad 212 is formed of a conductive material such as aluminum (Al), aluminum copper (AlCu) and may be formed by, for example, chemical vapor deposition (CVD), physical vapor deposition (PVD) or other suitable deposition processes. The conductive pad 212 may be referred to as an aluminum (Al) pad. In an exemplary process, an opening that exposes a conductive feature (e.g., one of the metal lines 210) of the interconnection structure 206 may be formed. The conductive pad 212 may be formed by first depositing a blanket layer of a conductive material such as aluminum. For example, CVD, PVD, or the like may be used to deposit a layer of aluminum over interconnection structure 206, the opening, and the conductive feature (e.g., the metal line 210). A photoresist layer (not separately illustrated) may then be formed over the aluminum layer and the aluminum layer may be etched to form the conductive pad 212. In some embodiments, the conductive material may be formed using a plating process, such as using an electroplating or electroless plating process, or the like. The conductive pad 212 may be formed using other techniques in other embodiments, and all such techniques are considered within the scope of this disclosure. In some embodiments, the conductive material of the conductive pad 212 may be different than the conductive material of the metal lines 210. For example, the conductive pad 212 may be formed of aluminum and the metal lines 210 may be formed of copper, though other conductive materials may be used.

Referring to FIGS. 1 and 3-6, method 100 includes a block 104 where a first dielectric structure 214 is formed over the workpiece 200. The first dielectric structure 214 is a multi-layer structure and includes multiple dielectric layers having various functions. More specifically, with respect to FIG. 3, the first dielectric structure 214 includes a dielectric layer 214a formed on a top surface of the conductive pad 212 without being formed on sidewall surfaces of the conductive pad 212 and the top surface of the interconnection structure 206. The dielectric layer 214a is configured to increase resolution of photolithography and/or etching. The dielectric layer 214a may be referred to as an anti-reflective layer. In an embodiment, the dielectric layer 214a includes silicon oxynitride (SiON). A thickness of the dielectric layer 214a may be between about 100 Å and about 500 Å to substantially avoid underexposure and overexposure to provide satisfactory device performance. After forming the dielectric layer 214a, with respect to FIG. 4, the forming of the first dielectric structure 214 proceeds to forming a dielectric layer 214b over the workpiece 200. The dielectric layer 214b functions as a bonding film. In an embodiment, the dielectric layer 214b includes un-doped silicate glass (USG). A thickness of the dielectric layer 214b may be between about 400 Å and about 800 Å such that the dielectric layer 214b is able to provide satisfactory adhesion to reduce potential cracks and buckling. The dielectric layer 214b may be conformally formed on the workpiece 200. That is, the dielectric layer 214b includes a first portion in direct contact and over the dielectric layer 214a and a second portion extending along sidewall surfaces of the conductive pad(s) 212 and the top surface of the interconnection structure 206.

Figure 5:
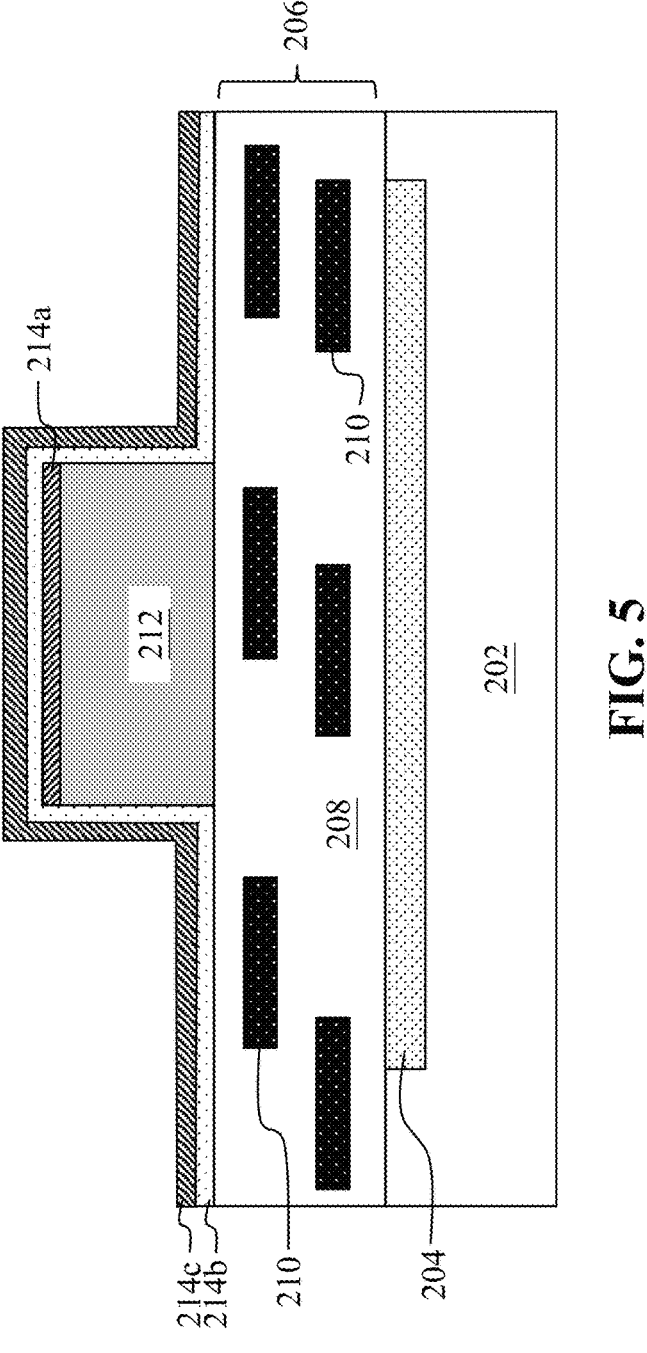

After forming the dielectric layer 214b, with respect to FIG. 5, the forming of the first dielectric structure 214 proceeds to forming an etch stop layer 214c on the dielectric layer 214b. The etch stop layer 214c is configured to indicate the etch end point of a subsequent etching process (e.g., etching process 240 described with reference to FIG. 14). In an embodiment, the etch stop layer 214c includes silicon nitride (SiN). A thickness of the etch stop layer 214c may be between about 500 Å and about 1000 Å to reduce under etching and over etching. The etch stop layer 214c may be conformally formed on the workpiece 200.

Figure 6:
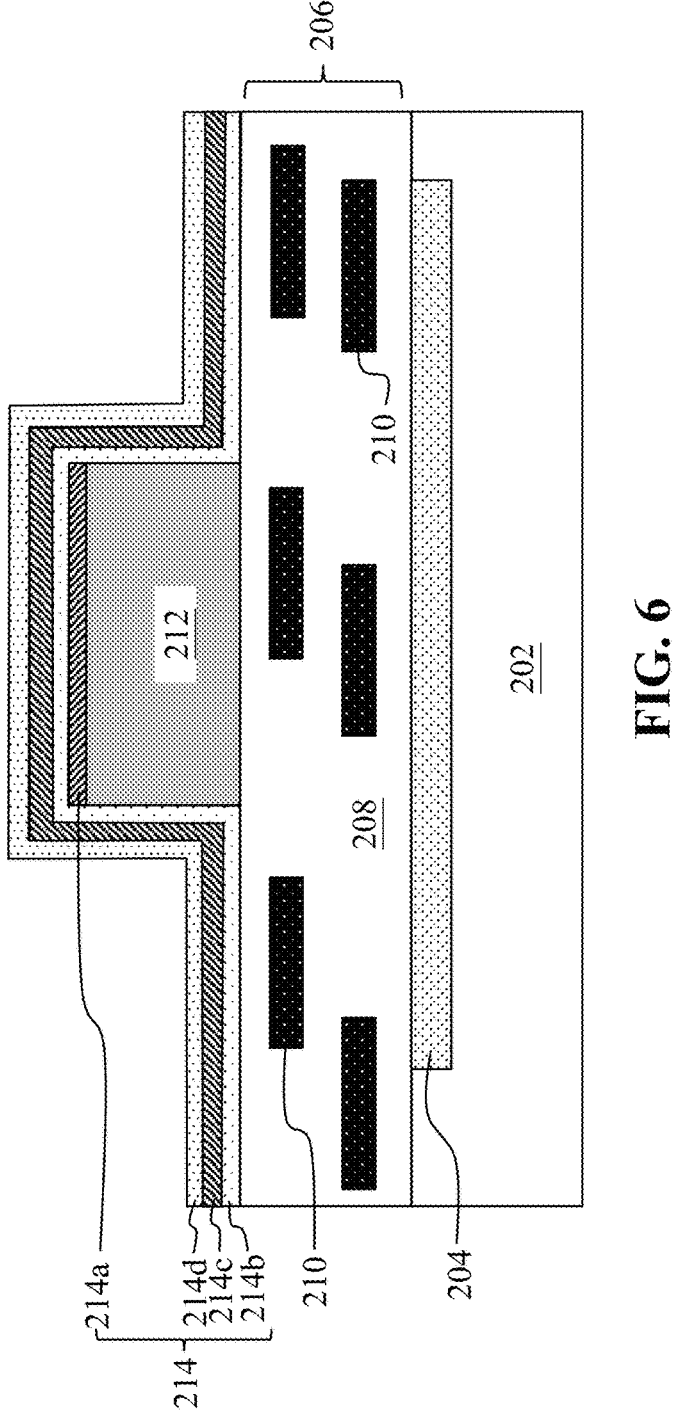

With respect to FIG. 6, after forming the etch stop layer 214c, the forming of the first dielectric structure 214 proceeds to forming a dielectric layer 214d on the etch stop layer 214c. In some embodiments, the dielectric layer 214d has a thickness between about 2 kÅ and about 4 kÅ and may include undoped silicate glass (USG). The layers 214a-214d may be collectively referred to as the first dielectric structure 214.

Figure 7:

Referring to FIGS. 1 and 7, method 100 includes a block 106 where an oxide liner 216 is formed on the first dielectric structure 214. The oxide liner 216 is configured to bond the second dielectric structure 220 (described with reference to FIGS. 8-9) with the first dielectric structure 214. In an embodiment, the oxide liner 216 includes silicon oxide formed by a high-density plasma (HDP) deposition process 218 (e.g., HDP-CVD) and precursors of this deposition process includes silane (SiH$_4$) and oxygen (O$_2$). The oxide liner 216 may be also referred to as an HDP liner 216. In the present embodiment, to reduce cracks, peeling, and/or warpage caused by subsequent etching processes and unsatisfactory adhesion between the first dielectric structure 214 and the second dielectric structure 220, the high-density plasma (HDP) deposition process 218 is performed at a radio frequency (RF) bias power between about 400 W and about 600 W, and a ratio of the flow rate of oxygen (O$_2$) to the flow rate of silane is between about 1.5 and 2. By forming the oxide liner 216 under these deposition conditions, a ratio of an atomic percentage of silicon to an atomic percentage of oxygen in the oxide liner 216 is less than 0.5 (oxide rich). For example, the ratio may be between about 0.3 and about 0.5, and the oxide liner 216 may thus have more Si—O—Si bonds at the interface between the oxide liner 216 and the second dielectric structure 220 and at the interface between the oxide liner and the first dielectric structure 214. Therefore, the adhesion between the second dielectric structure 220 and the first dielectric structure 214 may be advantageously improved, and cracks/peeling/warpage may be reduced. The oxide liner 216 may be referred to as an oxide-rich liner 216. In some embodiments, the HDP deposition process 218 may be performed at a temperature between about 300° C. and about 500° C. to enlarge the pull back window of the bonding structure 248 (shown in FIG. 19) which will be electrically coupled to and in physical contact with the conductive pad 212 to reduce device leakage. In some embodiments, to form the oxide-rich liner 216, a flow rate of silane (SiH$_4$) may be less than 100 sccm, and a flow rate of oxygen (O$_2$) may be between about 100 sccm and 200 sccm.

Figure 8:
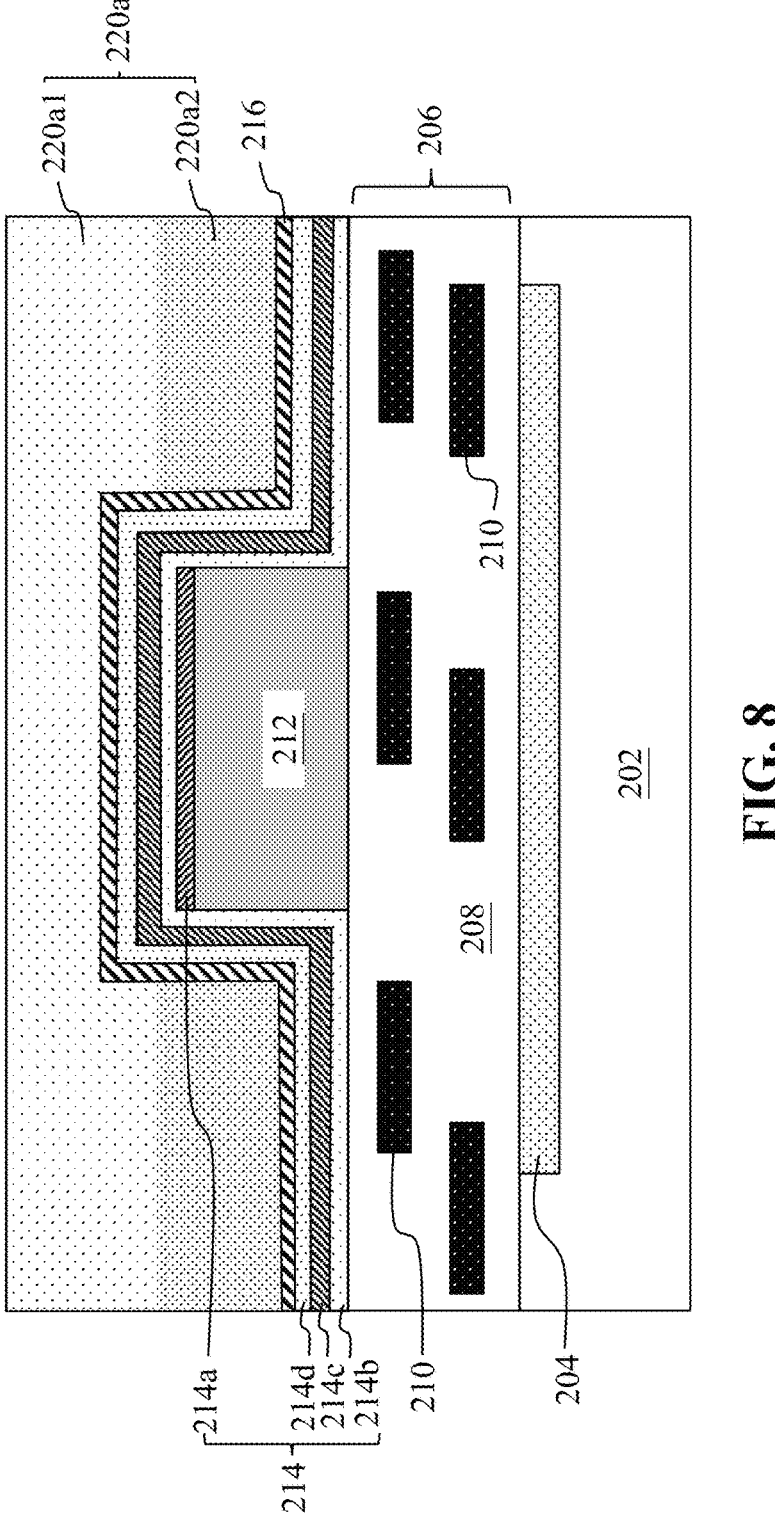
Figure 9:

Referring to FIGS. 1 and 8-9, method 100 includes a block 108 where a second dielectric structure 220 is formed over the workpiece 200. The second dielectric structure 220 is also a multi-layer structure and includes multiple dielectric layers configured to fulfill various functions. More specifically, with respect to FIG. 8, the formation of the second dielectric structure 220 includes forming a dielectric layer 220a on the oxide liner 216. The dielectric layer 220a may function as a polishing film, and a thickness of the dielectric layer 220a may be between about 1kÅ and about 3KÅ to reduce over polishing and under polishing, thereby providing satisfactory uniformity. In the present embodiments, to provide better adhesion between the dielectric layer 220a and the oxide liner 216, a lower portion 220a2 of the dielectric layer 220a is deposited at a first deposition rate, and an upper portion 220a1 of the dielectric layer 220a is deposited at a second deposition rate, the first deposition rate is less than the second deposition rate. By forming the lower portion 220a2 of the dielectric layer 220a at a lower deposition rate could advantageously improve the film quality and thus provide a better adhesion between the dielectric layer 220a and the oxide liner 216. In addition, depositing the upper portion 220a1 of the dielectric layer 220a at a higher rate would compensate the longer time spent on the formation of the lower portion 220a2 of the dielectric layer 220a, thus, a total time spent on the formation of the dielectric layer 220a would not be significantly affected. In an embodiment, to provide the satisfactory adhesion between the lower portion 220a2 of the dielectric layer 220a and the oxide liner 216, the lower portion 220a2 of the dielectric layer 220a is deposited at a temperature that is similar to that of the deposition temperature of the oxide liner 216 and at a RF bias power that is greater than that of the oxide liner 216. In an embodiment, the lower portion 220a2 of the dielectric layer 220a is deposited at a temperature between about 300° C. and about 500° C. and at a RF bias power between about 6.5 kW and about 9 kW. Due to the deposition conditions, the lower portion 220a2 of the dielectric layer 220a may provide compressive stress that is between about −100 dyne/cm$^2$ and 0.

After forming the dielectric layer 220a, with respect to FIG. 9, the forming of the second dielectric structure 220 proceeds to forming an etch stop layer 220b on the dielectric layer 220a. The etch stop layer 220b is configured to indicate the etch end point of a subsequent etching process (e.g., etching process 236 described with reference to FIG. 13). In an embodiment, the etch stop layer 220b includes silicon nitride. A thickness of the etch stop layer 220b is greater than the thickness of the etch stop layer 214c. In an embodiment, to reduce under etching and over etching, the thickness of etch stop layer 220b may be between about 5kÅ and about 10KÅ. The etch stop layer 220b may be conformally formed on the workpiece 200. Still referring to FIG. 9, after forming the etch stop layer 220b, a dielectric film 220c is formed on the etch stop layer 220b. In an embodiment, the dielectric film 220c includes tetra ethyl ortho silicate (TEOS), and a thickness of the dielectric film 220c may be between about 4kÅ and about 8KÅ. The layers 220a-220c may be collectively referred to as the second dielectric structure 220.

Still referring to FIGS. 1 and 9, method 100 includes a block 110 where a third dielectric structure 222 is formed over the workpiece 200. The third dielectric structure 222 is also a multi-layer structure and includes multiple dielectric layers configured to fulfill various functions. More specifically, with respect to FIG. 9, the formation of the third dielectric structure 222 includes forming an etch stop layer 222a on the dielectric film 220c of the second dielectric structure 220. The etch stop layer 222a is configured to indicate the etch end point of a subsequent etching process (e.g., etching process 224 described with reference to FIG. 10). In an embodiment, the etch stop layer 222a includes silicon nitride. To reduce under etching and over etching, a thickness of the etch stop layer 222a may be between about 0.5kÅ and about 1KÅ. In an embodiment, the thickness of the etch stop layer 222a may be substantially equal to the thickness of the etch stop layer 214c. Still referring to FIG. 9, after forming the etch stop layer 222a, a dielectric film 222b is formed on the etch stop layer 222a. In an embodiment, the dielectric film 222b includes tetra ethyl ortho silicate (TEOS), and a thickness of the dielectric film 222b may be between about 5kÅ and about 10KÅ. A bonding film 222c is then formed on the dielectric film 222b. In an embodiment, the bonding film 222c includes USG. To provide satisfactory adhesion between the dielectric film 222b and the dielectric layer 222d, the bonding film 222c may have a thickness between about 2kÅ and about 5KÅ. Still referring to FIG. 9, the third dielectric structure 222 also includes a dielectric layer 222d formed on the bonding film 222c. The dielectric layer 222d is configured to increase resolution of photolithography and/or etching that will be performed in subsequent fabrication processes. In an embodiment, the dielectric layer 222d includes silicon oxynitride (SiON). To substantially avoid underexposure and overexposure to provide satisfactory device performance, a thickness of the dielectric layer 222d may be between about 0.5kÅ and about 1 kÅ. The layers 222a-222d may be collectively referred to as the third dielectric structure 222. In the present embodiments, to reduce potential defects caused by forming those dielectric structures over the IC substrate 202, the third dielectric structure 222 is formed at a temperature that is lower than those of the first and second dielectric structures 214 and 220. For example, the etch stop layer 222a may be formed at a temperature lower than that of the etch stop layer 220b and that of the etch stop layer 214c.

Figure 10:
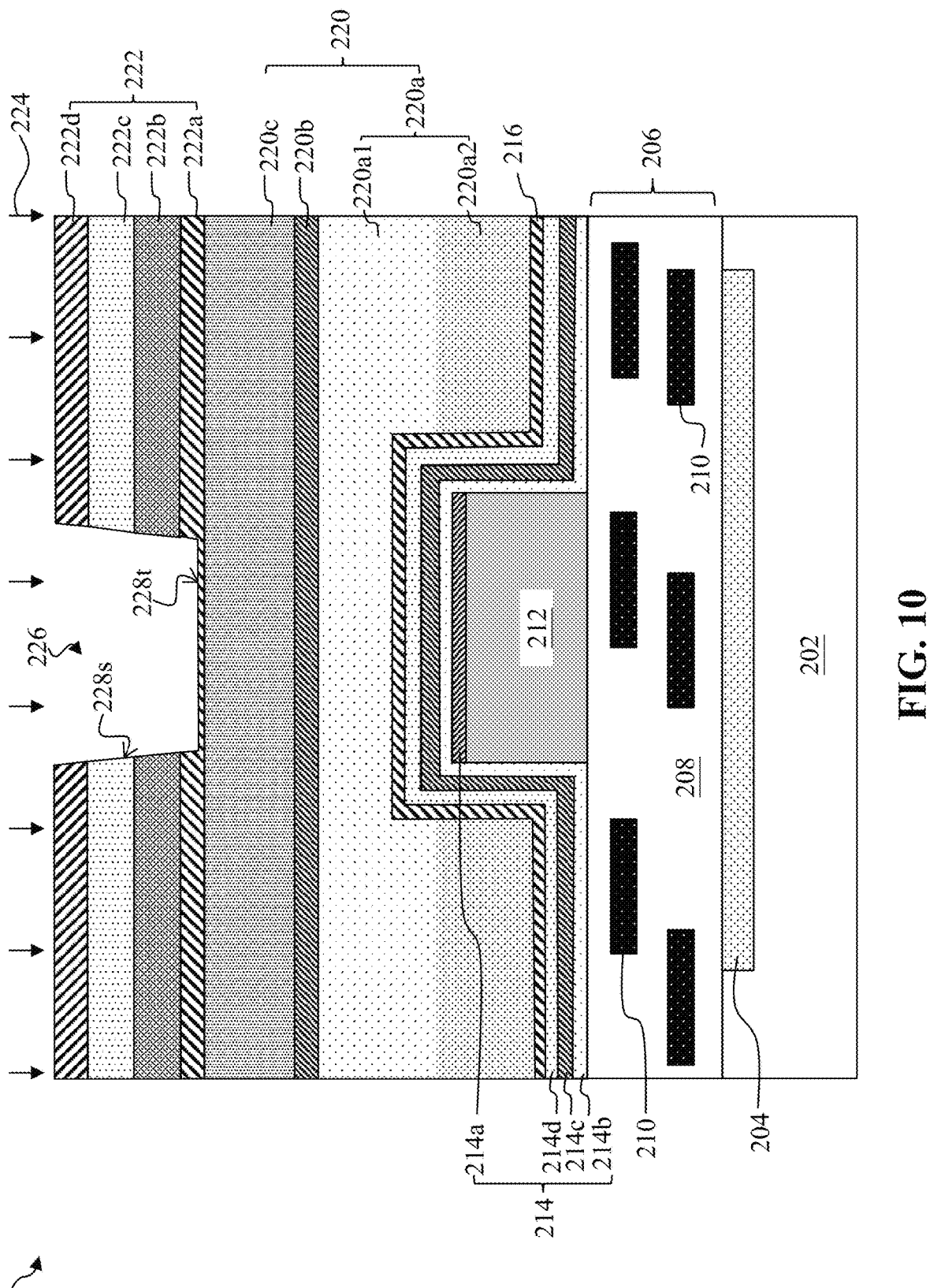

Referring to FIGS. 1 and 10, method 100 includes a block 112 where a first etching process 224 is performed to form a first opening 226 in the third dielectric structure 222. In some implementations, a combination of lithography and the etching processes are performed to define the first opening 226 illustrated in FIG. 10. For example, forming the first opening 226 includes performing a lithography process to form a patterned resist layer on the dielectric layer 222d and performing the first etching process 224 to transfer a pattern defined in the patterned resist layer to the third dielectric structure 222. The lithography process can include forming a resist layer (not shown) on the dielectric layer 222d (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The first etching process 224 uses the patterned resist layer as an etch mask to remove portions of the third dielectric structure 222 to form the first opening 226.

In an embodiment, the first etching process 224 includes a dry etching process and it stops once the etch stop layer 222a is partially etched. In an embodiment, the first etching process 224 is performed at a pressure between about 10 mTorr and 50 mTorr and at a RF bias power between about 500 W and about 800 W. An etchant of the first etching process 224 includes a gas mixture of $C_4F_6$ and $C_4F_8$, and the $C_4F_6$ content is greater than the $C_4F_8$ content. In an embodiment, the etchant contains about 70% to about 80% $C_4F_6$ by volume and about 20% to about 30% $C_4F_8$ by volume. As depicted in FIG. 10, the first opening 226 is defined by sidewall surfaces 228s of the partially etched third dielectric structure 222 and a top surface 228t of the partially etched etch stop layer 222a. That is, the first opening 226 partially extends into the etch stop layer 222a. In other words, sidewall surfaces of the layers 222d, 222c, 222*b* and a portion of the sidewall surfaces of the etch stop layer 222*a* are exposed in the first opening 226. After the performing of the first etching process 224, the patterned resist layer is removed from workpiece 200, for example, by a resist stripping process.

Figure 11:
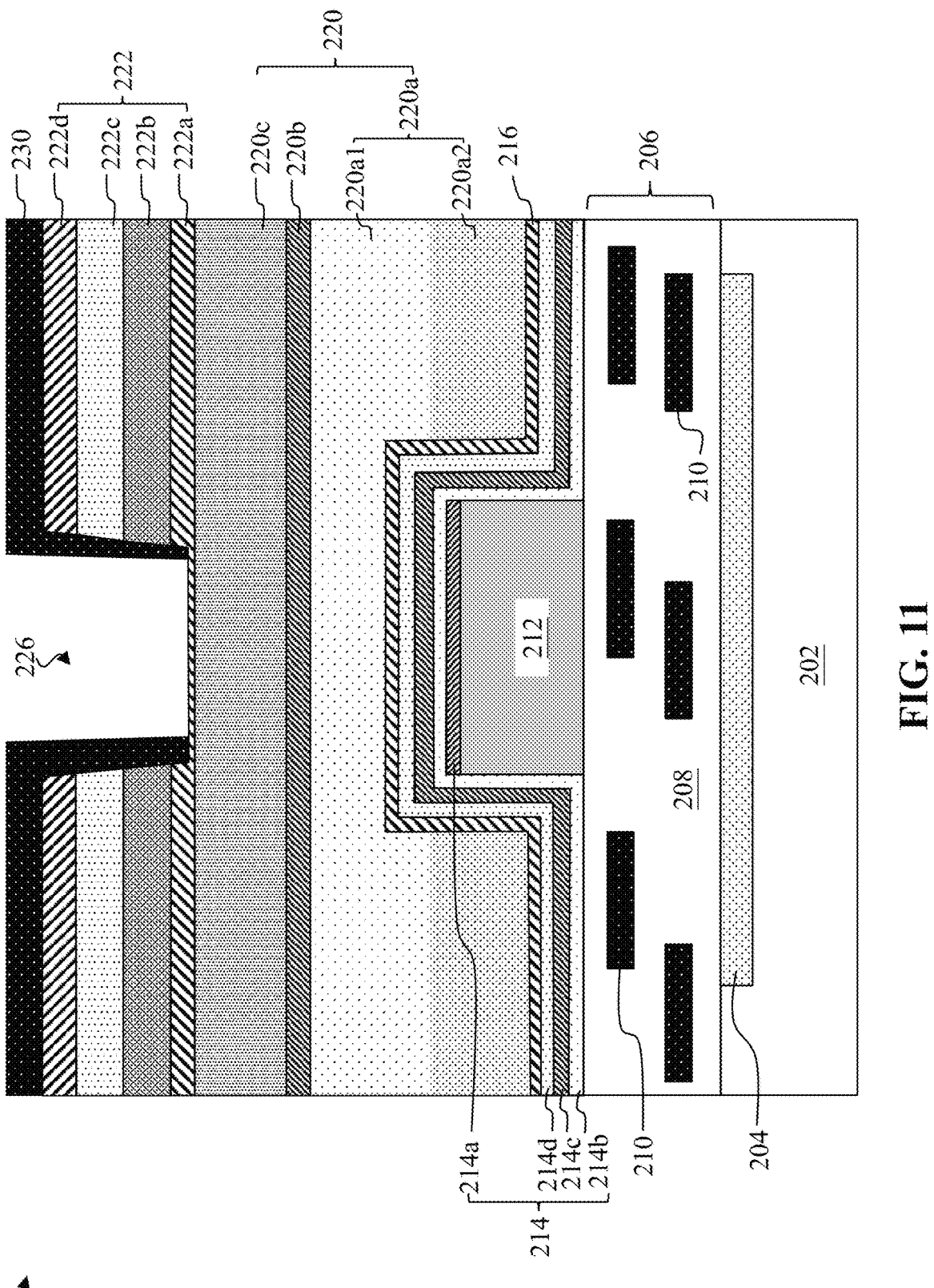

Referring to FIGS. 1 and 11, method 100 includes a block 114 where a patterned mask film 230 is formed along a top surface of the third dielectric structure 222 and sidewall surfaces 228*s* of the third dielectric structure 222 exposed in the first opening 226. The patterned mask film 230 may be formed over the workpiece 200 by any suitable process. In some implementations, a combination of lithography and the etching processes are performed to form the patterned mask film 230. For example, a photoresist layer (not shown) is formed on the workpiece 200 by, for example, spin coating. An exposure process is then performed using a mask. During the exposure process, a portion of the photoresist layer that is formed directly on the partially etched etch stop layer 222*a* is exposed to radiation energy (such as ultraviolet (UV) light, deep UV (DUV) light, or extreme UV (EUV) light) while a portion of the photoresist layer that is formed directly on a top surface of the dielectric layer 222*d* and extending along the sidewall surfaces 228*s* are not exposed. A developing process may be then performed to remove the exposed portion of the photoresist layer, thereby forming the patterned mask film 230. The patterned mask film 230 covers a portion of the top surface 228*t* of the partially etched etch stop layer 222*a* and exposes a portion of the top surface 228*t* of the partially etched etch stop layer 222*a*.

Figure 12:
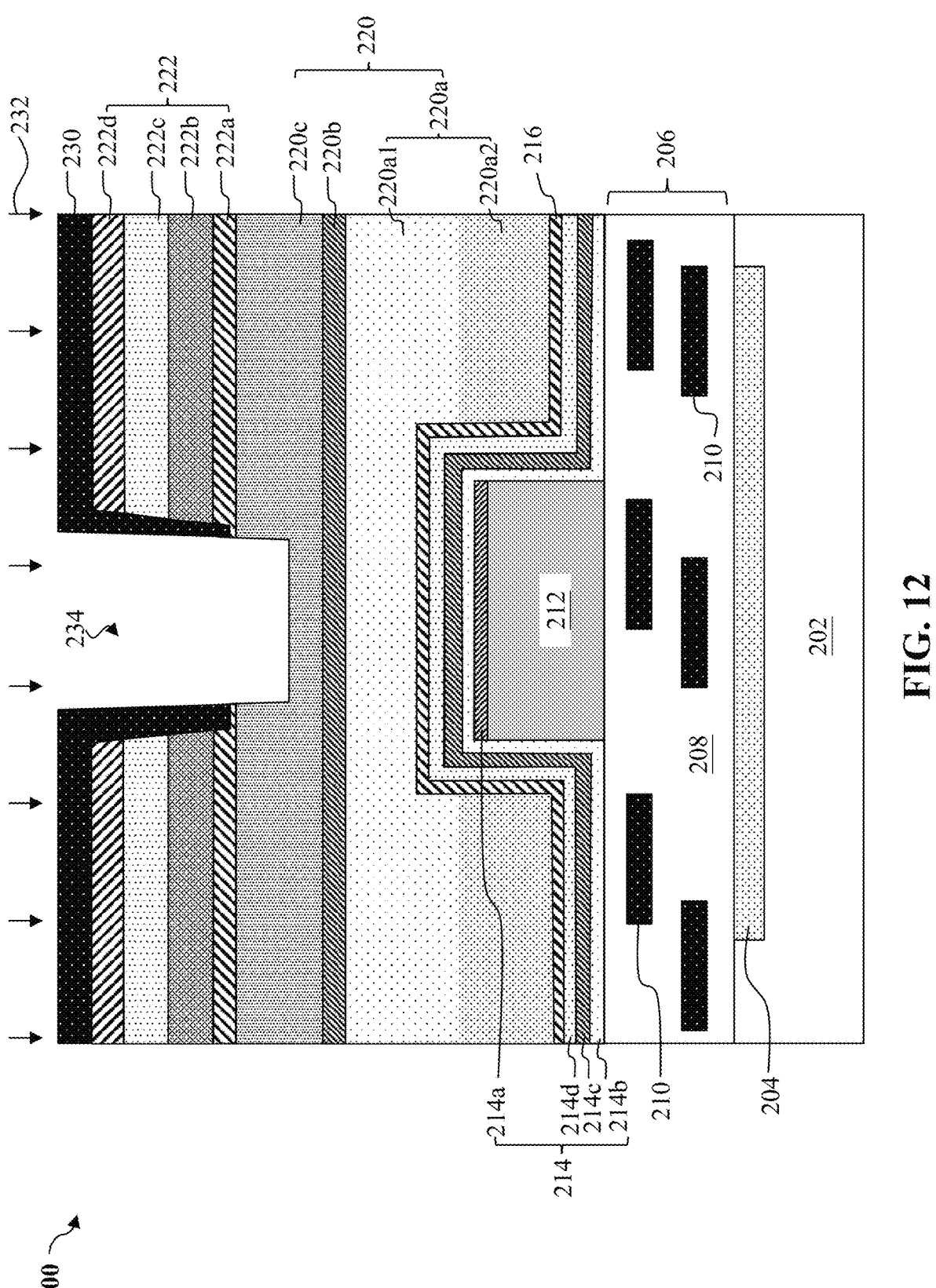

Referring to FIGS. 1 and 12, method 100 includes a block 116 where a second etching process 232 is performed to vertically extend the first opening 226 into the dielectric film 220*c* of the second dielectric structure 220, thereby forming an extended first opening 234. The extended first opening 234 may be referred to as the second opening 234. The second etching process 232 uses the patterned mask film 230 as an etch mask to remove portions of the etch stop layer 222*a* exposed in the first opening 226 and a portion of the second dielectric structure 220 thereunder. In this embodiment, unlike the first etching process 224 whose etch end point is provided by the etch stop layer 222*a*, the extent at which the second dielectric structure 220 is recessed is controlled by duration of the second etching process 232. In an embodiment, the duration of the second etching process 232 is less than about 50 seconds, and after the performing of the second etching process 232, the dielectric film 220*c* of the second dielectric structure 220 is partially etched.

In an embodiment, the second etching process 232 includes a dry etching process performed at a pressure between about 10 mTorr and 50 mTorr and at a RF bias power between about 500 W and about 800 W. An etchant of the second etching process 232 is either formed of $C_4F_6$ or is a gas mixture that includes $C_4F_6$ and $C_4F_8$, and the $C_4F_6$ content is greater than the $C_4F_8$ content. In an embodiment, the etchant contains about 90% to about 100% $C_4F_6$ by volume and about 0% to about 10% $C_4F_8$ by volume. That is, the first etching process 224 and the second etching process 232 may implement the same etchant, and the $C_4F_6$ content of the etchant of the second etching process 232 is greater than the $C_4F_6$ content of the etchant of the first etching process 224.

Figure 13:
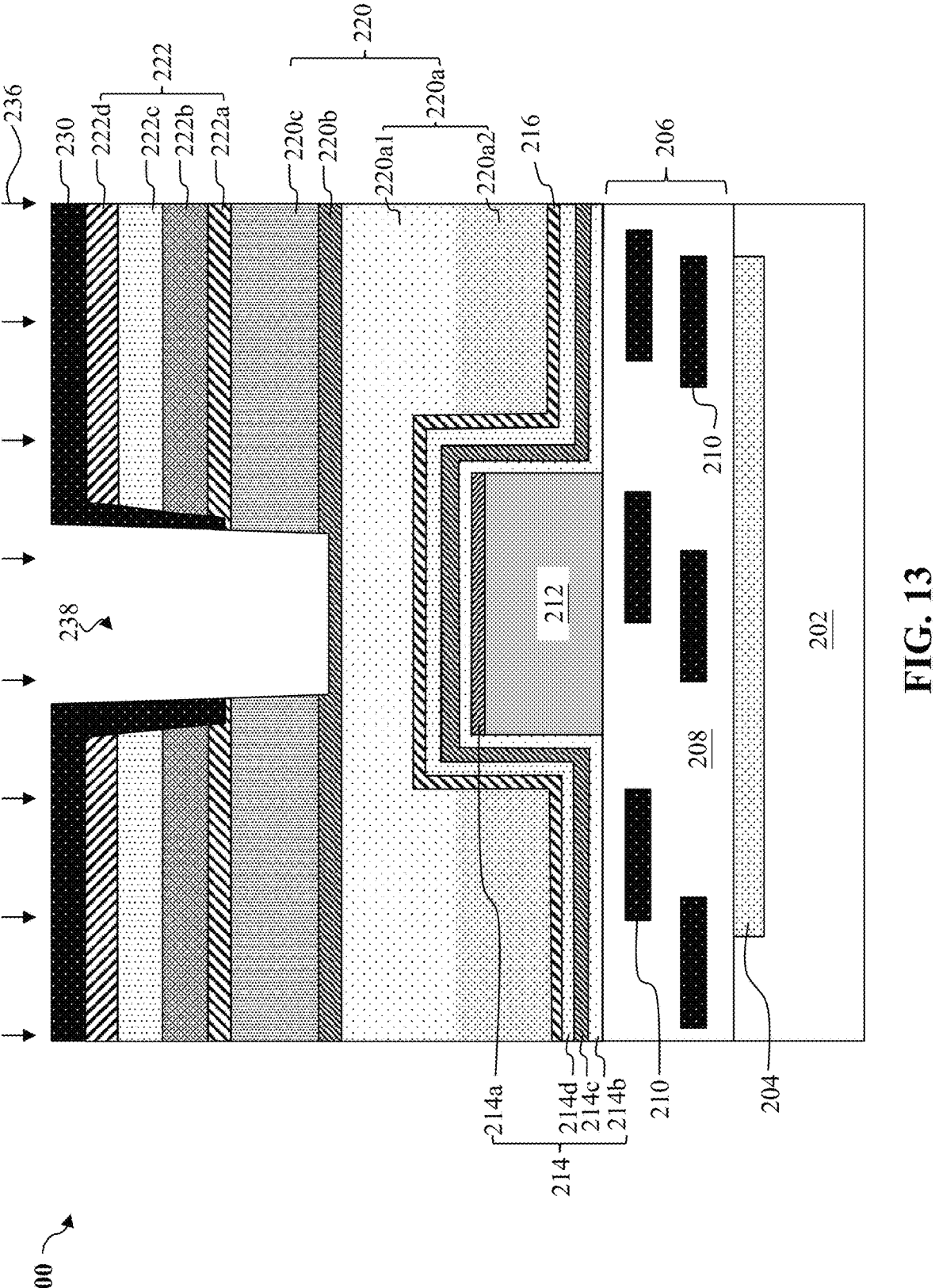

Referring to FIGS. 1 and 13, method 100 includes a block 118 where a third etching process 236 is performed to vertically extend the second opening 234 while using the patterned mask film 230 as an etch mask, thereby forming an extended second opening 238. The vertically extended second opening 238 may be referred to as the third opening 238.

In the present embodiments, the third etching process 236 is similar to the first etching process 224. For example, the third etching process 236 includes a dry etching process and it stops once the etch stop layer 220*b* is exposed. The etch stop layer 220*b* may also be partially etched. The third etching process 236 may also be performed under conditions that are same to those of the first etching process 224. For example, the third etching process 236 may also be performed at the same pressure and same RF bias power and include the same etchant as those of the first etching process 224. In an embodiment, the etchant of the third etching process 236 contains about 70% to about 80% $C_4F_6$ by volume and about 20% to about 30% $C_4F_8$ by volume.

Figure 14:
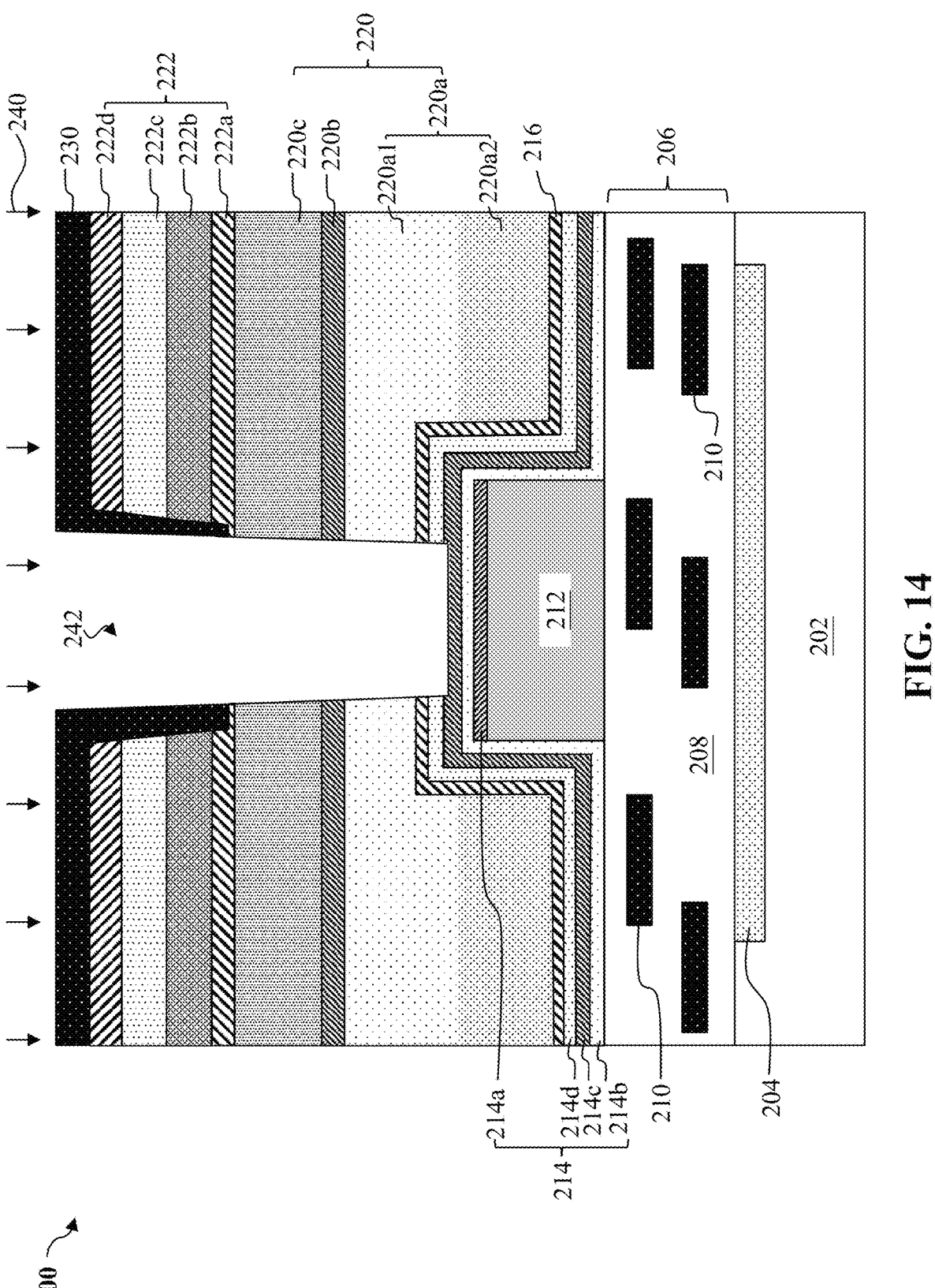

Referring to FIGS. 1 and 14, method 100 includes a block 120 where a fourth etching process 240 is performed to vertically extend the third opening 238 while using the patterned mask film 230 as an etch mask, thereby forming an extended third opening 242. The vertically extended third opening 242 may be referred to as the fourth opening 242. In the present embodiments, the fourth etching process 240 is similar to the second etching process 232. For example, the fourth etching process 240 includes a dry etching process and may be performed under conditions that are same to those of the second etching process 232. For example, the fourth etching process 240 may also be performed at the same pressure and same RF bias power and include the same etchant as those of the second etching process 232. In an embodiment, the etchant of the fourth etching process 240 contains about 90% to about 100% $C_4F_6$ by volume and about 0% to about 10% $C_4F_8$ by volume. The difference between the fourth etching process 240 and the second etching process 232 includes that, instead of controlling the etch duration, the fourth etching process 240 stops once the etch stop layer 214*c* is exposed. The etch stop layer 214*c* may also be partially etched.

Figure 15:
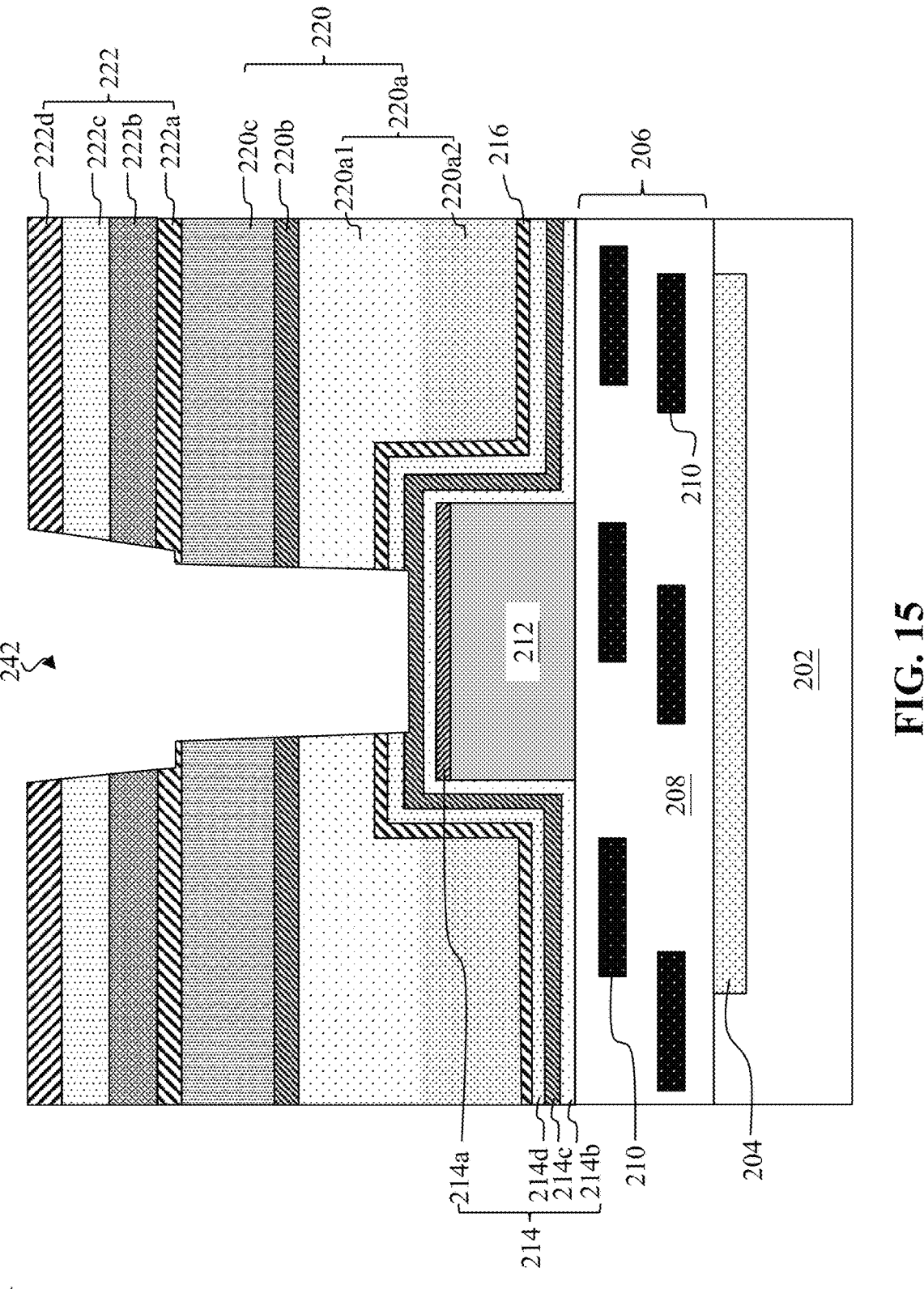

Referring to FIGS. 1 and 15, method 100 includes a block 122 where the patterned mask film 230 is selectively removed. After the forming of the fourth opening 242, the patterned mask film 230 is selectively removed. In some embodiments, the selective removal of the patterned mask film 230 may include performing one or more ashing processes. In an embodiment, the selective removal of the patterned mask film 230 may include performing a two-stage ashing that includes a first ashing process and a second ashing process. Since the etching processes 232, 236 and 240 use the patterned mask film 230 as an etch mask, after the removal of the patterned mask film 230, a shape of the fourth opening 242 includes a funnel-shape in a cross-sectional view.

Figure 16:
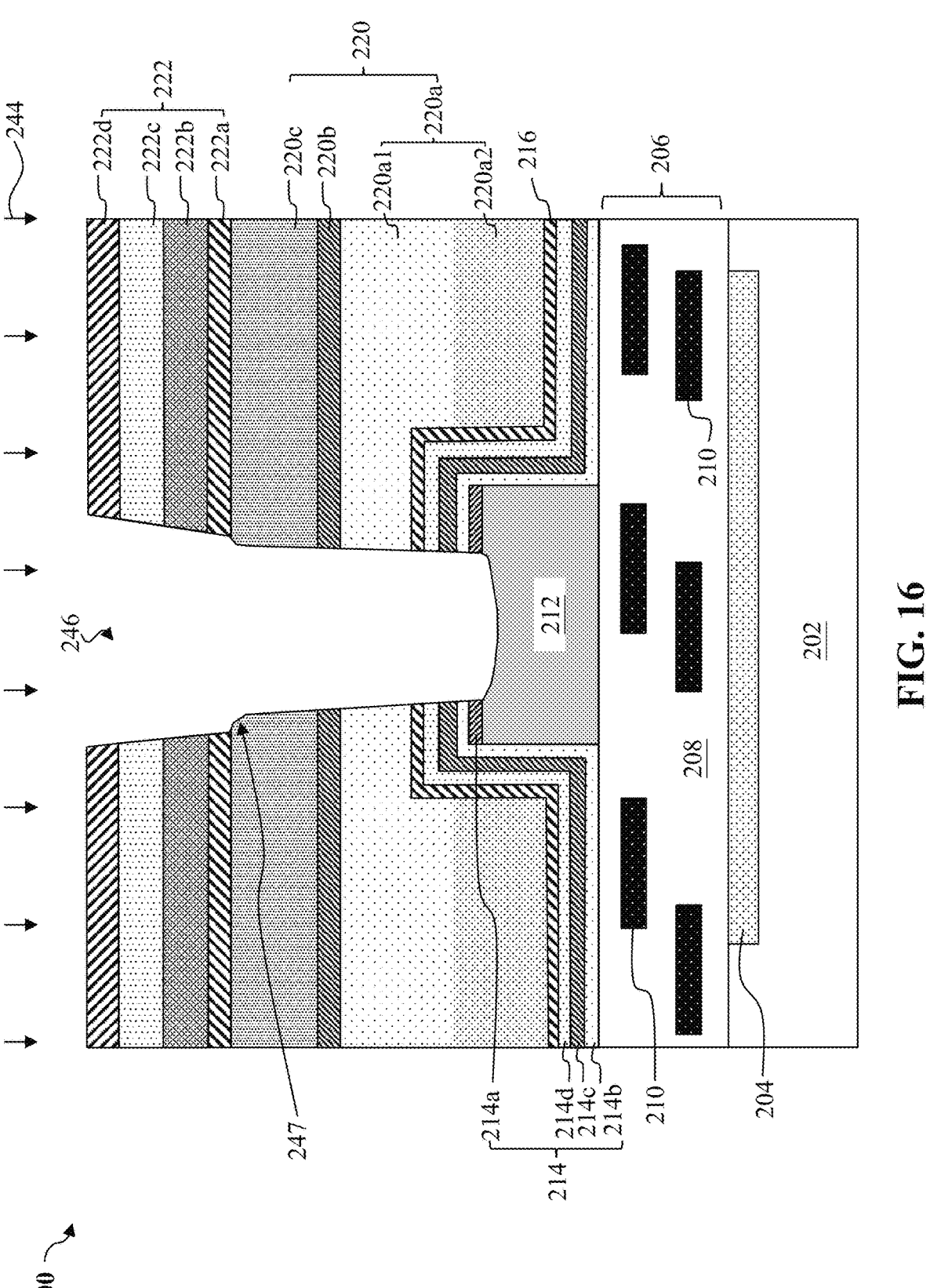

Referring to FIGS. 1 and 16, method 100 includes a block 124 where a fifth etching process 244 is performed to vertically extend the fourth opening 242 to expose a top surface of the conductive pad 212, resulting a vertically extended fourth opening 246. The vertically extended fourth opening 246 may also be referred to as the fifth opening 246. In the present embodiments, the fifth etching process 244 includes a dry etching process. The fifth etching process 244 is performed at a pressure less than about 50 mTorr and at a RF bias power less than the RF bias power associated with the first etching process 224. In an embodiment, the RF bias power associated with the fifth etching process 244 is between about 70 W and about 450 W. An etchant of the fifth etching process 244 is different than the etchant of the first/second/third/fourth etching process 224/232/236/240. In an embodiment, the etchant of the fifth etching process 244 includes a gas mixture of $CF_4$ and $C_4F_8$, and the $CF_4$ content is greater than the $C_4F_8$ content. A ratio of a volume of the $CF_4$ to a volume of the $C_4F_8$ is greater than 2. In an embodiment, the etchant contains about 70% to about 80% $CF_4$ by volume and about 20% to about 30% $C_4F_8$ by volume. The extent at which the first dielectric structure 214 and the conductive pad 212 are recessed is controlled by duration of the fifth etching process 244. In an embodiment, the duration of the fifth etching process 244 is less than about 50 seconds, and after the performing of the fifth etching process 244, the conductive pad 212 is partially etched without being over etched. In some embodiments, the fifth etching process 244 also slightly etches the second dielectric structure 220 and the third dielectric structure 222. For example, corners of the etch stop layer 222a and the dielectric film 220c exposed in the fifth opening 246 may be rounded by the fifth etching process 244.

Figure 17:
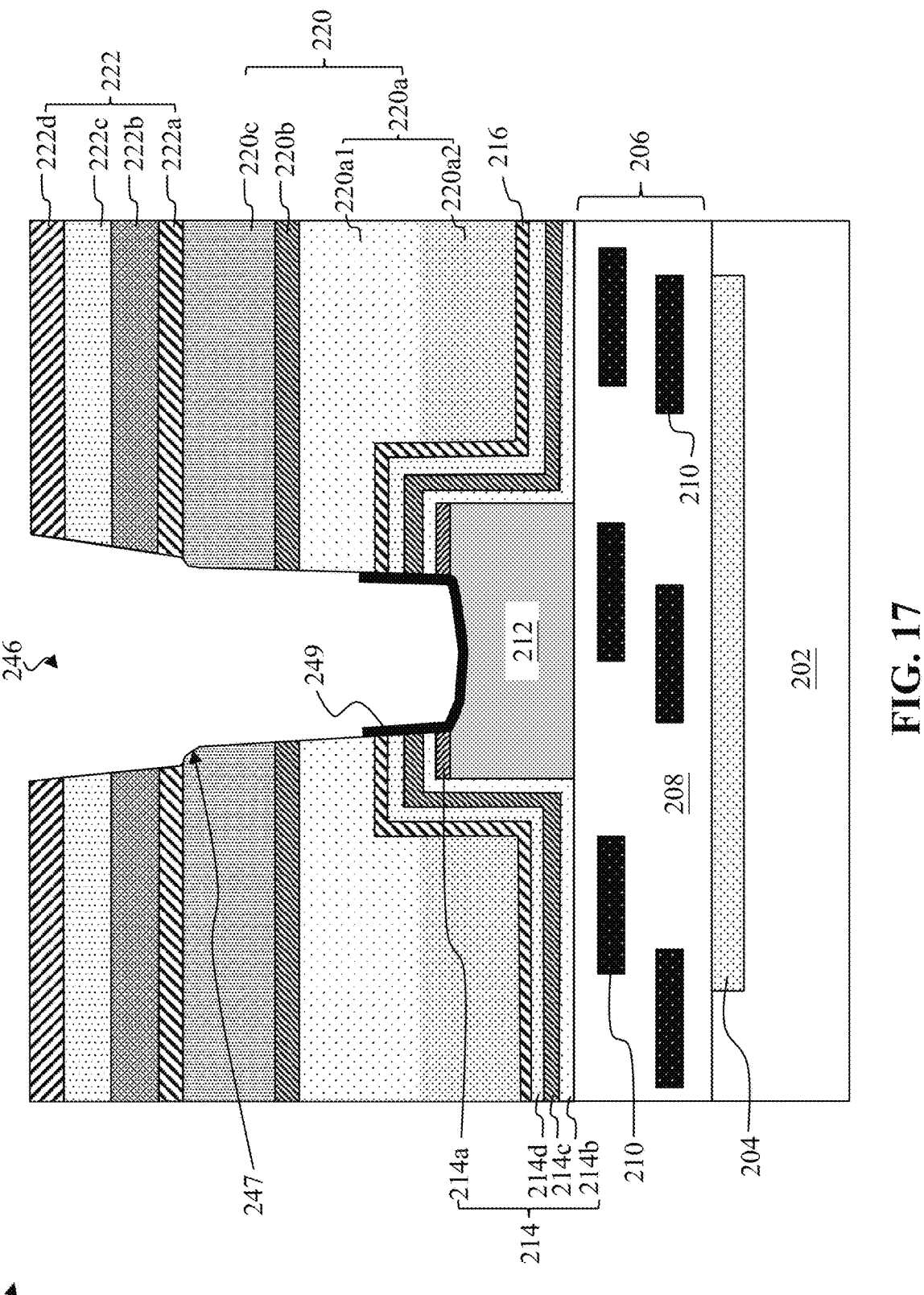
Figure 18:
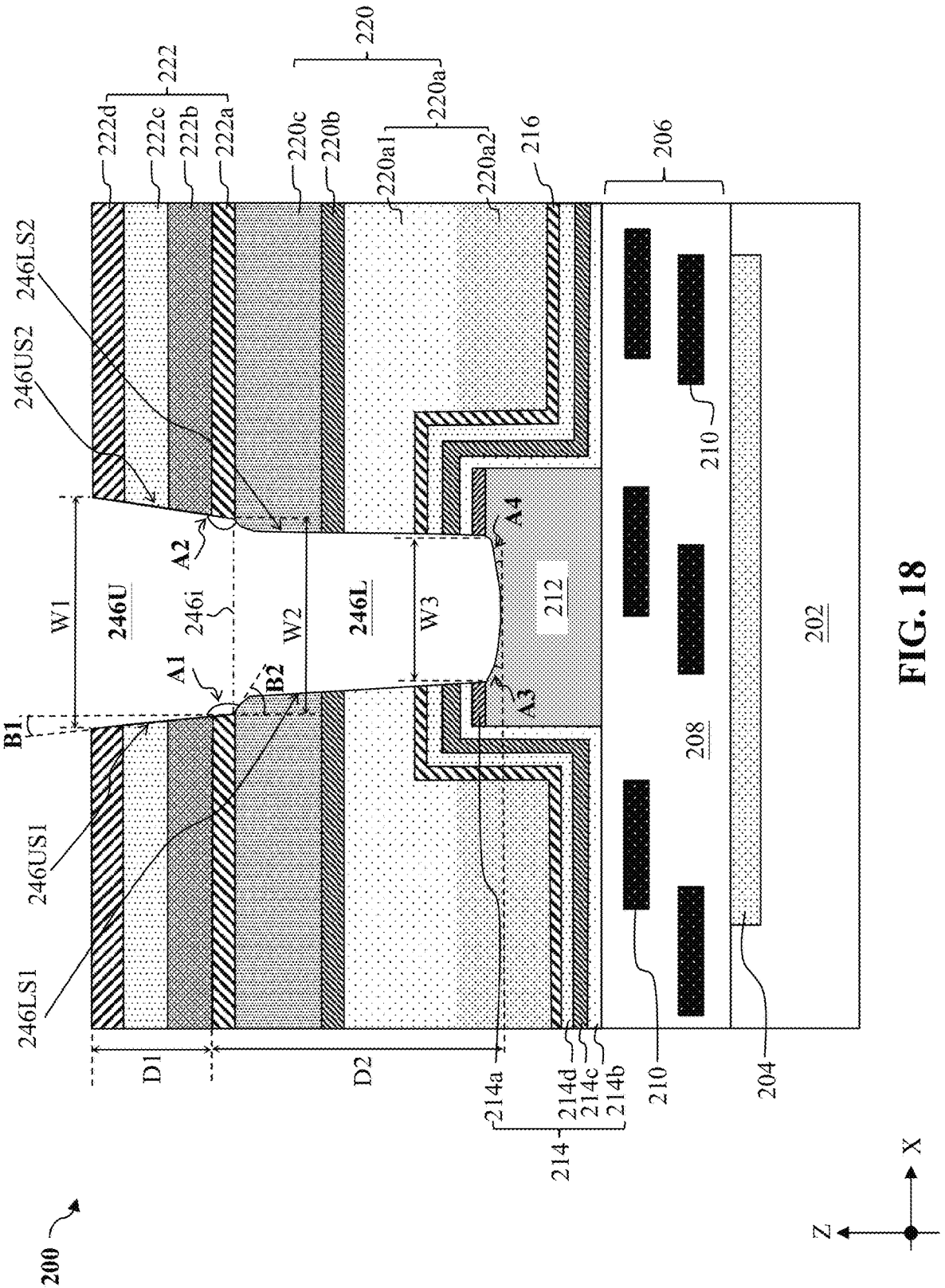

Referring to FIGS. 1 and 17-18, method 100 includes a block 126 where a cleaning process is performed to clean the fifth opening 246. In the present embodiments, after the performing of the first to fifth etching processes, there may be fluorine ions remaining in the fifth opening 246 and/or on surfaces of the dielectric layers exposed in the fifth opening 246. With respect to FIG. 17, a polymer layer 249 is deposited on the bottom surface and a lower portion of sidewall surfaces of the fifth opening 246 and configured to trap the fluorine ions. With respect to FIG. 18, the polymer layer 249 may be then selectively removed along with the trapped fluorine ions. Thus, the fifth opening 246 may be cleaned, and the adhesion between the bonding structure 248 that will be formed in the fifth opening 246 and adjacent features (e.g., the conductive pad 212, the dielectric layers of the first, second, and third dielectric structures 214, 220, and 222) may be improved.

As depicted in the cross-sectional view represented by FIG. 18, the fifth opening 246 has a funnel shape. The fifth opening 246 includes an upper portion 246U extending through the third dielectric structure 222 and a lower portion 246L extending through both the first dielectric structure 214 and the second dielectric structure 220 and extending into the conductive pad 212. The dashed line indicates the virtual boundary/interface 246i between the upper portion 246U and the lower portion 246L of the fifth opening 246. Each of the upper portion 246U and the lower portion 246L of the fifth opening 246 also has a respective funnel shape. Sidewall surfaces 246US1 and 246US2 that define the boundary of the upper portion 246U of the fifth opening 246 are relatively smooth, and sidewall surfaces 246LS1 and 246LS2 that define the boundary of the lower portion 246L of the fifth opening 246 are less smooth than the sidewall surfaces 246US1 and 246US2 and include a kink 247 (shown in FIGS. 16-18 and 19) near the interface 246i because of the introduction of the patterned mask film 230 and the performing of the fifth etching process 244. In an embodiment, an angle A1 between the sidewall surface 246US1 and a topmost portion of the sidewall surface 246LS1 is between about 130° and about 170°, and an angle A2 between the sidewall surface 246US2 and a topmost portion of the sidewall surface 246LS2 is between about 130° and about 170°. The angle A1 may be equal to or different than the angle A2. In some embodiments, an angular difference between the angle A1 and the angle A2 is between about −20° and 20°. More specifically, due to the presence of the kink 247 (shown in FIGS. 16-17 and 19), an angle B1 between the sidewall surface 246US1 and the Z axis is less than an angle B2 between the topmost portion of the sidewall surface 246LS1 and the Z axis. In the present embodiment, both the angle B1 and the angle B2 are acute angles. The portion of the top surface of the conductive pad 212 exposed in the fifth opening 246 and the X axis also forms two angles A3 and A4. The angle A3 may be between about 10° and 40°, the angle A4 may be between about 10° and 40°, and an angular difference between the angle A3 and the angle A4 may be between about −15° and 15°. The ranges of the angles A1, A2, A3, and A4 are the results of the performing of the first, second, third, fourth, and fifth etching processes 224, 232, 236, 240, 244 described above and the formation and removal of the patterned mask film 230.

The upper portion 246U of the fifth opening 246 spans a width W1 along the X direction. In some embodiments, the width W1 may be between about 2000 nm and about 2500 nm. The interface 246i spans a width W2 along the X direction. The width W1 is greater than W2, and a ratio of the width W1 to the width W2 is between about 1.1 and 1.5. In some embodiments, the width W2 is between about 1600 nm and 2100 nm. The portion of the top surface of the conductive pad 212 exposed in the fifth opening 246 spans a width W3 along the X direction. The width W2 is greater than W3, and a ratio of the width W2 to the width W3 is between about 1.1 and 1.5. In some embodiments, the width W3 is between about 1000 nm and about 1500 nm. A depth D1 of the upper portion 246U of the fifth opening 246 is less than a depth D2 of the lower portion 246L of the fifth opening 246. In some embodiments, the depth D1 of the upper portion 246U of the fifth opening 246 may be between about 700 nm and about 900 nm, and the depth D2 of the lower portion 246L of the fifth opening 246 may be between about 2100 nm and about 2800 nm.

In some embodiments, the conductive pads 212 that are electrically connected to the interconnection structure 206 may be used as test pads before additional processing steps are performed. For example, the conductive pads 212 may be probed as part of a wafer-acceptance-test (WAT), a circuit test, a Known Good Die (KGD) test, or the like. The probing may be performed to verify the functionality of the active or passive devices of the IC substrate 202 or the respective electrical connections within the IC substrate 202 or interconnection structure 206. The probing may be performed by contacting a probe needle to the conductive pads 212. Therefore, the conductive pads 212 may also be referred to as probe pads 212. The probe needle may be a part of a probe card that includes multiple probe needles which, for example, may be connected to testing equipment. By applying the first, second, third, fourth, and fifth etching processes 224, 232, 236, 240, and 244 to the first, second, and third dielectric structures 214, 220, and 222, the conductive pad 212 formed directly under the fifth opening 246 may be exposed without being under etched or over etched. Therefore, damages that may occur to the conductive pad 212 may be advantageously reduced, and voids that may be formed in the bonding structure 248 (to be formed in the fifth opening 246, shown in FIG. 19) may be also advantageously reduced, and contact resistance Rc tested by the WAT may be reduced. In addition, forming the oxide-rich oxide liner 216 between the first dielectric structure 214 and the second dielectric structure 220 advantageously improves interface attachment and enhance film strength and thus reduces or substantially avoid cracks, peeling, and/or warpage of dielectric layers in the first dielectric structure 214 and the second dielectric structure 220, which further reduces contact resistance Rc.

Figure 19:
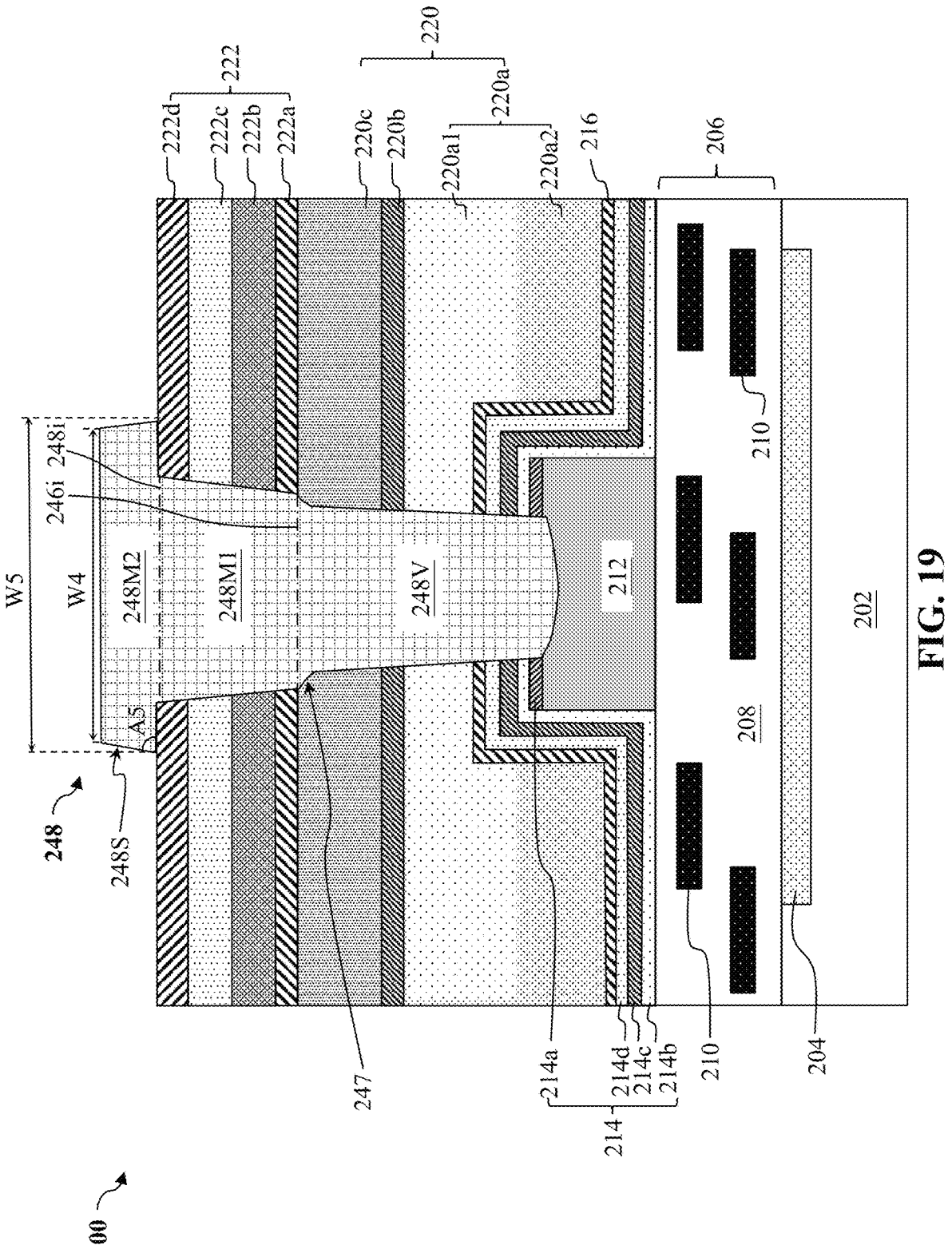

Referring to FIGS. 1 and 19, method 100 includes a block 128 where a bonding structure 248 is formed in the fifth opening 246. The formation of the bonding structure 248 may include depositing a conductive material over the workpiece 200 and into the fifth opening 246. In some embodiments, the conductive material may include a bilayer structure. For example, to deposit the conductive material, a barrier layer (not separately labeled) is first conformally deposited over the third dielectric structure 222 and into the fifth opening 246 using a suitable deposition technique, such as ALD, PVD or CVD and then a metal fill layer (not separately labeled) is deposited over the barrier layer using ALD, PVD, CVD, electroless plating, or electroplating. The barrier layer may include titanium nitride (TiN), tantalum nitride (TaN), or another metal nitride. The metal fill layer may be formed of any suitable material, such as copper (Cu). In some embodiments, the conductive material may include a single-layer structure and is formed of, for example, copper (Cu). After the deposition of the conductive material, a planarization process (e.g., CMP) may be then performed such that the conductive material has a planar top surface. A top surface of the planarized conductive material is above a top surface of the dielectric layer 222d. A portion of the conductive material formed in the lower portion 246L of the fifth opening 246 may be referred to as a bonding pad via (BPV) 248V, and a portion of the conductive material formed in the upper portion 246U of the fifth opening 246 may be referred to as a first bonding pad metal line (BPM) 248M1. The bonding pad via 248V tracks the shape of the lower portion 246L of the fifth opening 246, and the first bonding pad metal line 248M1 tracks the shape of the upper portion 246U of the fifth opening 246, and repeated description of associated dimensions are thus omitted for reason of simplicity. It is noted that, the dashed line just indicates a virtual boundary/interface 246i between the first bonding pad metal line (BPM) 248M1 and the bonding pad via 248V, there is no physical interface between the first bonding pad metal line (BPM) 248M1 and the bonding pad via 248V.

After the performing of the planarization process, an etching process is applied to the planarized conductive material to finalize the profile of the bonding structure 248. In an embodiment, a patterned mask film (e.g., a patterned photoresist layer) is formed on the planarized conductive material and covers a portion of the conductive material formed directly over the fifth opening 246. While using the patterned mask film as an etch mask, the etching process is then performed to etch a portion of the conductive material over the top surface of the third dielectric structure 222 to form a second bonding pad metal line (BPM) 248M2. In an embodiment, the second bonding pad metal line (BPM) 248M2 refers to a portion of the conductive material formed on and over the third dielectric structure 222. A dashed line 248i is shown to indicate the virtual boundary between the second bonding pad metal line (BPM) 248M2 and the first bonding pad metal line (BPM) 248M1.

The etching process configured to facilitate the formation of the second BPM 284M2 may include a dry etching, a wet etching, or a combination thereof. The etching process may be tuned with various etching parameters, such as etchant used, etching temperature, etching solution concentration, etching pressure, source power, RF bias voltage, RF bias power, etchant flow rate, and/or other suitable parameters. After the etching process, as depicted in FIG. 19, in a cross-sectional view, the second BPM 284M2 includes a trapezoidal shape. A sidewall surface 248S of the second BPM 284M2 and the top surface of the third dielectric structure 222 form an angle A5, the angle A5 is an acute angle. In the present embodiments, a portion of a bottom surface of the second bonding pad metal line (BPM) 248M2 is in direct contact and coplanar with the top surface of the third dielectric structure 222. The top surface of the second BPM 248M2 spans a width W4 along the X direction and is greater than the width W1 (shown in FIG. 18). In some embodiments, a ratio of the width W4 to the width W1 is between about 1.1 and 1.6. In the cross-sectional view represented by FIG. 19, the bottom surface of the second BPM 284M2 spans a width W5 along the X direction and is greater than the width W4.

It is noted that, the second bonding pad metal line (BPM) 248M2, the first bonding pad metal line (BPM) 248M1, and the bonding pad via 248V are formed from the same conductive material and thus have the same composition. It is further understood that the second bonding pad metal line (BPM) 248M2, the first bonding pad metal line (BPM) 248M1, and the bonding pad via 248V are portions of an integral bonding structure 248. In other words, the integral bonding structure 248 includes an upper portion (i.e., the second BPM 248M2) formed on the third dielectric structure 222, a middle portion (i.e., the first BPM 248M1) formed in the upper portion of the fifth opening 246, and a lower portion (i.e., the bonding pad via 248V) formed in the lower portion of the fifth opening 246, and there are no physical interfaces among the second bonding pad metal line (BPM) 248M2, the first bonding pad metal line (BPM) 248M1, and the bonding pad via 248V. A profile of a cross-sectional view of the integral bonding structure 248 also resembles a funnel shape.

In embodiments represented in FIG. 19, only one bonding structure 248 is explicitly shown. However, it is understood that the workpiece 200 may include any suitable number of bonding structures 248. Besides functional bond structures that are used for bonding to device dies, or through vias to land, the workpiece 200 may also include dummy bond structures. The dummy bond structures are electrically isolated from the interconnection structure 206.

Figure 20:
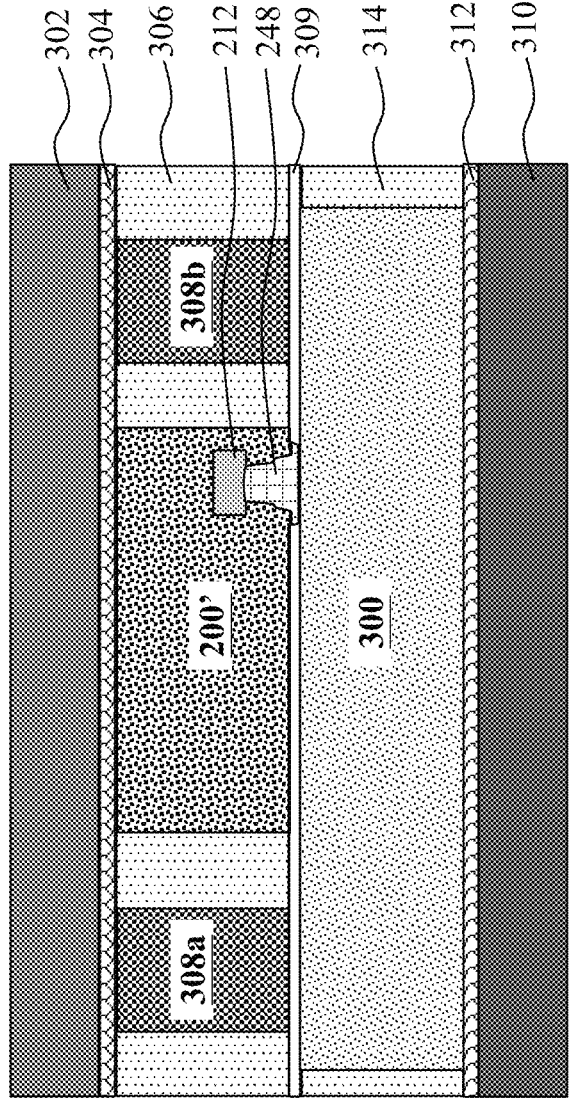

Referring to FIGS. 1 and 20, method 100 includes a block 130 where further processes are performed. Such further processes may include depositing a dielectric layer 309 over the workpiece 200 and forming additional bond pads in the dielectric layer 309. The dielectric layer 309 may be a single layer or a composite layer including a number of sub-layers formed of different materials. In some embodiments, the dielectric layer 309 is formed of silicon oxide, silicon oxynitride, silicon oxy-carbide, or the like, and deposited using a deposition process such as CVD, PECVD, PVD, ALD, or the like. The additional bond pads may include dummy bond pads electrically floating in the dielectric layer 309.

Such further processes may include performing a singulation process along the scribe lines (not shown) of the workpiece 200 to separate adjacent device structures in the electrical circuitry 204 to form individual semiconductor dies 200'. Prior to the singulation process, the backside of the substrate 202 is attached to a carrier substrate 302 through an adhesive layer 304. The carrier substrate 302 may be formed of semiconductor materials (e.g., silicon), or may be a glass substrate, a ceramic substrate, or the like. The adhesive layer 304 may include a die attach film (DAF) such as an epoxy resin, a phenol resin, acrylic rubber, silica filler, or a combination thereof, and is applied using a lamination technique. The singulation process may include a plasma dicing process, a laser dicing process, a sawing process, or a combination thereof. Dielectric regions 306 (otherwise known as "gap-fill dielectric" regions) are formed surrounding the semiconductor die 200', in some embodiments. The dielectric regions 306 may be formed from one or more layers of silicon oxide, PSG, BSG, BPSG, FSG, silicon nitride, the like, or a combination thereof. The dielectric material of the dielectric regions 306 may be formed using a deposition process such as CVD, PECVD, PVD, the like, or a combination thereof. The individual semiconductor die 200′ is used in subsequent process steps to bond with another semiconductor die 300 (see FIG. 20). In some embodiments, the semiconductor die 200′ is a memory die such as a dynamic random-access memory (DRAM) die, a static random-access memory (SRAM) die, a flash memory die, or may be another type of die. In some embodiments, the semiconductor die 300 includes a logic die, which may be a central processing unit (CPU) die, a micro control unit (MCU) die, an input-output (IO) die, a baseband (BB) die, an application processor (AP) die, or the like.

Such further processes may also include, before bonding the semiconductor die 200′ with the semiconductor die 300, attaching the semiconductor die 300 to a carrier substrate 310 through an adhesive layer 312. The carrier substrate 310 may be a silicon substrate (e.g., a silicon wafer), a glass substrate, an organic substrate (e.g., a panel), or the like. The adhesive layer 312 may be substantially similar to the adhesive layer 304 discussed above. Dielectric regions 314 are formed surrounding the semiconductor die 300, in some embodiments. The dielectric regions 314 may be formed from one or more layers of silicon oxide, PSG, BSG, BPSG, FSG, silicon nitride, the like, or a combination thereof. The dielectric material of the dielectric regions 314 may be formed using a deposition process such as CVD, PECVD, PVD, the like, or a combination thereof. In the illustrated embodiment, the semiconductor die 200′ is smaller than a total area of the semiconductor die 300. In some embodiments, one or more semiconductor dies (e.g., semiconductor dies 308a, 308b) may be arranged adjacent to the semiconductor die 200′ and bonded to the semiconductor die 300. In some embodiments, the semiconductor dies 308a and 308b are electrically insulated from the semiconductor die 200′ by the dielectric material of the dielectric regions 306, and thus the semiconductor dies 308a and 308b may be referred to as dummy dies. In some embodiments, the semiconductor materials and conductive materials of features of the dummy dies 308a and 308b provide additional paths for conducting heat generated by the semiconductor dies 200′ and 300. The semiconductor die 200′ (and the dummy dies 308a-308b) may be then bonded to the semiconductor die 300. The bonding operation may be performed through a pick-and-place procedure. After the bonding operation, although not explicitly shown, the bonding structure 248 of the semiconductor die 200′ may be in direct contact and electrically coupled to a conductive feature (e.g., a through semiconductor via (TSV), a bonding structure that is similar to the bonding structure 248, or a metal line) of the semiconductor die 300. The bonded semiconductor dies 200′ and 300 are jointly referred to as the structure 400. The bonding of the semiconductor die 200′ to the semiconductor die 300 may be achieved through hybrid bonding.

Such further processes may also include forming under-bump metallurgies (UBMs) in the structure 400. In some embodiments, each of the UBMs includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included in the UBMs. Such further processes may also include bonding the structure 400 to a substrate, the substrate may be a printed circuit board (PCB), a substrate of another semiconductor die, an interposer die, or a substrate of other suitable devices.

Although not intended to be limiting, one or more embodiments of the present disclosure provide many benefits to a semiconductor structure and the formation thereof. For example, the present disclosure provides a funnel-shape bonding structure. In the present embodiments, a combination of five etching processes are performed to form a trench for forming the bonding structure therein. By implementing those etching processes, conductive pad (e.g., A1 pad) exposed in the trench may not be substantially damaged. In addition, a multi-layer dielectric structure is formed over the conductive pad, and an oxide-rich liner is sandwiched by two dielectric structures that will be exposed in the trench. Providing the oxide-rich liner may advantageously improve adhesion between the two dielectric structures and reduce peeling, cracks and/or warpage associated with the two dielectric structures.

The present disclosure provides for many different embodiments. Semiconductor structures and methods of fabrication thereof are disclosed herein. In one exemplary aspect, the present disclosure is directed to a method. The method includes forming a first dielectric structure over a conductive pad, depositing a first etch stop layer on the first dielectric structure, forming a second dielectric structure on the first etch stop layer, depositing a second etch stop layer on the second dielectric structure, forming a third dielectric structure on the second etch stop layer, performing a first etching process to form a first opening extending through the third dielectric structure and exposing the second etch stop layer, forming a mask film extending along sidewalls of the third dielectric structure exposed by the first opening, performing a second etching process to vertically extend the first opening to expose the first etch stop layer, selectively removing the mask film, performing a third etching process to further vertically extend the first opening to expose the conductive pad, and forming a conductive bonding structure in the further extended first opening.

In some embodiments, the forming of the first dielectric structure includes forming an anti-reflective layer on a top surface of the conductive pad, and conformally depositing an oxide layer over the anti-reflective layer, wherein a portion of the oxide layer is in direct contact with a sidewall surface of the conductive pad. In some implementations, an etchant of the third etching process includes a mixture of $CF_4$ and $C_4F_8$. In some implementations, a ratio of a volume of $CF_4$ to a volume of $C_4F_8$ is greater than 2. In some instances, an etchant of the first etching process is different than the etchant of the third etching process. In some embodiments, the forming of the mask film is performed before the performing of the second etching process, and the selectively removing of the mask film is performed before the performing of the third etching process. In some embodiments, the forming of the second dielectric structure includes forming an oxide liner sandwiched between a first oxide layer and a second oxide layer, forming a third etch stop layer over the oxide liner and on the second oxide layer, and forming a third oxide layer on the third etch stop layer. In some embodiments, the oxide liner includes silicon oxide, and a ratio of an atomic percentage of silicon to an atomic percentage of oxygen is between about 0.3 and about 0.5. In some embodiments, the forming of the oxide liner is conducted under a radio frequency bias power between about 400 W and about 600 W. In some instances, the second oxide layer includes a lower portion deposited under a first deposition rate and an upper portion deposited under a second deposition rate greater than the first deposition rate. In some instances, in a cross-sectional view, a shape of the bonding structure includes a funnel shape.

In another exemplary aspect, the present disclosure is directed to a method. The method includes providing a workpiece including a conductive pad formed over a substrate, forming a multi-layer passivation structure on the conducive pad, patterning a top portion of the multi-layer passivation structure to form a first opening, forming a mask film on sidewall surfaces of the patterned top portion of the multi-layer passivation structure, after the forming of the mask film, performing a first etching process to remove a portion of the multi-layer passivation structure directly under the first opening to form a second opening, after the performing of the first etching process, selectively removing the mask film, performing a second etching process to remove a portion of the multi-layer passivation structure directly under the second opening, thereby forming a third opening exposing the conductive pad, wherein an etchant of the second etching process is different than an etchant of the first etching process, and forming a conductive bonding structure in the third opening.

In some embodiments, the etchant of the second etching process includes a mixture of $CF_4$ and $C_4F_8$. In some implementations, the etchant of the first etching process includes a mixture of $C_4F_6$ and $C_4F_8$. In some embodiments, the first etching process is performed at a first pressure, the second etching process is performed at a second pressure smaller than the first pressure. In some implementations, the first etching process is performed at a first bias power and the second etching process is performed at a second bias power smaller than the first bias power. In some instances, the performing of the first etching process includes performing a number of etching processes configured to etch different layers in the multi-layer passivation structure. In some embodiments, the method further includes, after the performing of the second etching process, cleaning the third opening by applying a polymer layer on a bottom surface of the third opening and then selectively removing the polymer layer.

In yet another exemplary aspect, the present disclosure is directed to a semiconductor structure. The semiconductor structure includes a conductive pad formed over a substrate, a multi-layer passivation structure over the conductive pad, wherein the multi-layer passivation structure includes a dielectric film, and a ratio of an atomic percentage of silicon to an atomic percentage of oxygen is between about 0.3 and about 0.5, and a bonding structure extending through the multi-layer passivation structure and electrically coupled to the conductive pad. In a cross-sectional view, a shape of the bonding structure includes a funnel shape.

In some embodiments, the conductive pad includes aluminum, and the bonding structure includes copper.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first dielectric structure over a conductive pad;
depositing a first etch stop layer on the first dielectric structure;
forming a second dielectric structure on the first etch stop layer;
depositing a second etch stop layer on the second dielectric structure;
forming a third dielectric structure on the second etch stop layer;
performing a first etching process to form a first opening extending through the third dielectric structure and exposing the second etch stop layer;
forming a mask film extending along sidewalls of the third dielectric structure exposed by the first opening;
performing a second etching process to vertically extend the first opening to expose the first etch stop layer;
selectively removing the mask film;
performing a third etching process to further vertically extend the first opening to expose the conductive pad; and
forming a conductive bonding structure in the further vertically extended first opening.

2. The method of claim 1, wherein the forming of the first dielectric structure comprises:
forming an anti-reflective layer on a top surface of the conductive pad; and
conformally depositing an oxide layer over the anti-reflective layer, wherein a portion of the oxide layer is in direct contact with a sidewall surface of the conductive pad.

3. The method of claim 1, wherein an etchant of the third etching process comprises a mixture of $CF_4$ and $C_4F_8$.

4. The method of claim 3, wherein a ratio of a volume of $CF_4$ to a volume of $C_4F_8$ is greater than 2.

5. The method of claim 3, wherein an etchant of the first etching process is different than the etchant of the third etching process.

6. The method of claim 1, wherein the forming of the mask film is performed before the performing of the second etching process, and the selectively removing of the mask film is performed before the performing of the third etching process.

7. The method of claim 1, wherein the forming of the second dielectric structure comprises:
forming an oxide liner sandwiched between a first oxide layer and a second oxide layer;
forming a third etch stop layer over the oxide liner and on the second oxide layer; and
forming a third oxide layer on the third etch stop layer.

8. The method of claim 7, wherein the oxide liner comprises silicon oxide, and a ratio of an atomic percentage of silicon to an atomic percentage of oxygen is between about 0.3 and about 0.5.

9. The method of claim 7, wherein the forming of the oxide liner is conducted under a radio frequency bias power between about 400 W and about 600 W.

10. The method of claim 7, wherein the second oxide layer comprises a lower portion deposited under a first deposition rate and an upper portion deposited under a second deposition rate greater than the first deposition rate.

11. The method of claim 1, wherein, in a cross-sectional view, a shape of the bonding structure comprises a funnel shape.

12. A method, comprising:

providing a workpiece comprising a conductive pad formed over a substrate;

forming a multi-layer passivation structure on the conducive pad;

patterning a top portion of the multi-layer passivation structure to form a first opening;

forming a mask film on sidewall surfaces of the patterned top portion of the multi-layer passivation structure;

after the forming of the mask film, performing a first etching process to remove a portion of the multi-layer passivation structure directly under the first opening to form a second opening;

after the performing of the first etching process, selectively removing the mask film;

performing a second etching process to remove a portion of the multi-layer passivation structure directly under the second opening, thereby forming a third opening exposing the conductive pad, wherein an etchant of the second etching process is different than an etchant of the first etching process; and forming a conductive bonding structure in the third opening.

13. The method of claim 12, wherein the etchant of the second etching process comprises a mixture of $CF_4$ and $C_4F_8$.

14. The method of claim 12, wherein the etchant of the first etching process comprises a mixture of $C_4F_6$ and $C_4F_8$.

15. The method of claim 12, wherein the first etching process is performed at a first pressure, the second etching process is performed at a second pressure smaller than the first pressure.

16. The method of claim 12, wherein the first etching process is performed at a first bias power, the second etching process is performed at a second bias power smaller than the first bias power.

17. The method of claim 12, wherein the performing of the first etching process comprises performing a number of etching processes configured to etch different layers in the multi-layer passivation structure.

18. The method of claim 12, further comprising:

after the performing of the second etching process, cleaning the third opening by applying a polymer layer on a bottom surface of the third opening and then selectively removing the polymer layer.

19. A semiconductor structure, comprising:

a conductive pad formed over a substrate;

a multi-layer passivation structure over the conductive pad, wherein the multi-layer passivation structure comprises a dielectric film, and a ratio of an atomic percentage of silicon to an atomic percentage of oxygen in the dielectric film is less than 0.5; and a bonding structure extending through the multi-layer passivation structure and electrically coupled to the conductive pad, wherein, in a cross-sectional view, a shape of the bonding structure comprises a funnel shape.

20. The semiconductor structure of claim 19, wherein the conductive pad comprises aluminum, and the bonding structure comprises copper.

* * * * *